(12) United States Patent
Koshido

(10) Patent No.: US 7,102,272 B2
(45) Date of Patent: Sep. 5, 2006

(54) PIEZOELECTRIC COMPONENT AND METHOD FOR MANUFACTURING THE SAME

(75) Inventor: Yoshihiro Koshido, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 176 days.

(21) Appl. No.: 10/484,341

(22) PCT Filed: Jul. 23, 2003

(86) PCT No.: PCT/JP03/09310

§ 371 (c)(1),
(2), (4) Date: Jan. 21, 2004

(87) PCT Pub. No.: WO2004/012332

PCT Pub. Date: Feb. 5, 2004

(65) Prior Publication Data

US 2004/0174090 A1    Sep. 9, 2004

(30) Foreign Application Priority Data

Jul. 31, 2002   (JP) .............................. 2002-222610
Jul. 16, 2003   (JP) .............................. 2003-198059

(51) Int. Cl.
*H03H 9/25* (2006.01)

(52) U.S. Cl. ................. 310/320; 310/340; 310/313 R; 310/366

(58) Field of Classification Search ............ 310/313 R, 310/320, 324, 340, 348, 365, 366
See application file for complete search history.

(56) References Cited

U.S. PATENT DOCUMENTS

| | | | | |
|---|---|---|---|---|
| 5,305,643 A | * | 4/1994 | Thomas et al. | ................ 73/704 |
| 6,337,531 B1 | * | 1/2002 | Nakahata et al. | ....... 310/313 R |
| 6,792,656 B1 | * | 9/2004 | Shimoe et al. | ............. 29/25.35 |
| 2004/0100164 A1 | * | 5/2004 | Murata et al. | ............... 310/348 |
| 2004/0195691 A1 | * | 10/2004 | Moriyasu et al. | ........... 257/758 |

FOREIGN PATENT DOCUMENTS

| | | | |
|---|---|---|---|
| JP | 64-051707 | | 2/1989 |
| JP | 08-116227 | | 5/1996 |
| JP | 08-213874 | * | 8/1996 |
| JP | 09-246905 | | 9/1997 |
| JP | 10-032293 | * | 2/1998 |
| JP | 10-093383 | | 4/1998 |
| JP | 11-150441 | | 6/1999 |
| JP | 11-251866 | | 9/1999 |
| JP | 2000-261285 | | 9/2000 |
| JP | 2001-060642 | | 3/2001 |
| JP | 2001-094390 | | 4/2001 |
| JP | 2001-244785 | | 9/2001 |
| JP | 2003-037471 | | 2/2003 |

* cited by examiner

*Primary Examiner*—Thomas M. Dougherty
(74) *Attorney, Agent, or Firm*—Keating&Bennett,LLP

(57) ABSTRACT

A SAW device includes a SAW element having an IDT and a conductive pad connected to the IDT provided on a piezoelectric substrate, and an external terminal. The SAW device also includes an insulating layer having an exciting portion protective opening defining a space for protecting a SAW-exciting portion including the IDT and a conductive opening. The external terminal is connected to the conductive pad through a wiring extending in the conductive opening.

9 Claims, 24 Drawing Sheets

PIEZOELECTRIC COMPONENT AND METHOD FOR MANUFACTURING THE SAME

BACKGROUND OF THE INVENTION

1. Field of the Invention

The present invention relates to piezoelectric components, such as surface acoustic wave devices and piezoelectric thin-film filters, used for delay lines and filters and a method for manufacturing the same. In particular, the present invention relates to piezoelectric components packaged in a chip and a method for manufacturing the same.

2. Description of the Related Art

In recent years, a decrease in the size and weight of electronic devices has caused a growing demand for multifunctional electronic components. In this case, piezoelectric components, such as surface acoustic wave filters (hereinafter referred to as SAW filters) used for SAW devices and piezoelectric filters including piezoelectric thin-film resonators, used for communication apparatuses such as portable phones are required to have decreased size and weight.

A piezoelectric filter includes piezoelectric resonators arranged in a ladder configuration or a lattice configuration. Each resonator includes a Si substrate having an opening or a recessed portion, and a vibrating portion provided by sandwiching the upper and lower surfaces of a thin-film portion having at least one layer of piezoelectric thin-film (comprising ZnO or AlN) provided on the opening or the recessed portion by at least a pair of upper and lower electrodes that face each other. Alternatively, the Si substrate may not include an opening or recessed portion, and a space may be provided between the lower electrode and the Si substrate. In this type of piezoelectric filter, thickness longitudinal vibration generated at the vibrating portion is used. Therefore, a space for vibration must be ensured and the vibrating portion must be protected against water and dust.

On the other hand, a SAW filter is provided by arranging interdigital transducers (hereinafter abbreviated as IDTs), each including a pair of comb-like electrodes including a metal such as Al, on a piezoelectric substrate including crystal, $LiTaO_3$, or $LiNbO_3$. In such a SAW filter, a vibrating space for the IDTs and a SAW-propagating portion on the piezoelectric substrate must be ensured, and the IDTs must be protected against water and dust.

In the above-described piezoelectric filter and SAW filter, a die bonding agent is applied to the bottom surface of a package including a ceramic material, such as alumina, elements of the piezoelectric filter or the SAW filter are mounted on the package by die bonding, a terminal in the package is connected to electrodes of the elements by wire bonding, and then the package is sealed with a lid. Alternatively, in the above-described piezoelectric filter and SAW filter, an electrode land is provided on the bottom surface of the package including alumina, elements of the piezoelectric filter or the SAW filter are mounted on the package by flip-chip bonding, and then the package is sealed with a lid so as to achieve miniaturization.

In the above-described configuration, however, even though the elements in the piezoelectric filter or the SAW filter are miniaturized, miniaturization and lower profile of the piezoelectric filter and SAW filter is not achieved unless the package is miniaturized. Also, the cost for compact package is high. Particularly, in the piezoelectric filter, the vibrating portion is provided on the opening or recessed portion of the substrate, and thus, the vibrating portion may be broken by impact caused by dicing of elements, and pick up or die bonding of elements when packaged.

In the following discussion, Patent Document 1 is Japanese Unexamined Patent Application Publication No. 2001-94390, Patent Document 2 is Japanese Unexamined Patent Application Publication No. 11-150441, Patent Document 3 is Japanese Unexamined Patent Application Publication No. 2001-60642, and Patent Document 4 is Japanese Unexamined Patent Application Publication No. 2001-244785.

On the other hand, bumps are used for packaging in Patent Documents 1 to 3. According to these Patent Documents, flip-chip mounting, in which a SAW element is bonded to a base substrate via bumps on the base substrate is used. In this method, space for wire bonding is not required, which results in miniaturization of the SAW filter. However, conductive pads corresponding to the bumps must be provided in the SAW element, which reduces an effective area of the SAW element. As a result, miniaturization of the SAW filter is difficult and the cost of forming the bumps is incurred.

In Patent Document 4, a SAW element is mounted on a base substrate provided with a through hole that faces a lead electrode of the SAW element and a conductive agent is filled in the through hole, so as to form an external circuit connecting portion. In this manner, the SAW filter is miniaturized.

In the configuration described in Patent Document 4, however, since the SAW filter is formed by bonding the base substrate to the SAW element, the thickness of the SAW filter increases due to the base substrate.

SUMMARY OF THE INVENTION

To overcome the problems described above, preferred embodiments of the present invention provide a compact piezoelectric component and a method for manufacturing the same.

A piezoelectric component according to a preferred embodiment of the present invention includes a piezoelectric element including at least one vibrating portion and an element wiring connected to the vibrating portion, which are provided on a substrate, and an external terminal. The piezoelectric component also includes an insulating layer including an opening defining a space for protecting the vibrating portion and a conductive opening. The external terminal is connected to the element wiring via an external terminal connecting member provided in the conductive opening.

With this configuration, the vibrating portion is protected by the opening defining a space for protecting the vibrating portion in the insulating layer. Therefore, degradation in the characteristics of the piezoelectric component caused by packaging is prevented. Also, the piezoelectric component does not require an element which increases the thickness of the piezoelectric component, such as a substrate that is provided to protect the vibrating portion, and thus miniaturization, lower profile, and a lower cost piezoelectric component are provided. Further, the position of the external terminal connected to the conductive opening can be arbitrarily changed on the insulating layer in accordance with an externally connected circuit. That is, the positioning freedom of the external terminal is increased.

Preferably, a protective film is provided in the opening. With this configuration, the vibrating portion is more reliably protected.

Also, the opening is preferably covered by a lid. With this configuration, the vibrating portion can be protected more reliably.

Further, a piezoelectric component according to another preferred embodiment of the present invention includes a piezoelectric element including at least one vibrating portion and an element wiring connected to the vibrating portion, which are provided on a substrate, and an external terminal. The piezoelectric component further includes an insulating layer which includes an opening defining a space for protecting the vibrating portion and a conductive opening and which is provided with a wiring connected to the element wiring through the conductive opening, and a second insulating layer which protects the wiring and which includes a second opening positioned over the opening and a second conductive opening, the second insulating layer being provided on the insulating layer. The external terminal is connected to the wiring through an external terminal connecting member provided in the second conductive opening.

With this configuration, since the wiring is protected by the second insulating layer, short circuiting caused by contact with the wiring at packaging of a SAW device is effectively prevented.

Additionally, in the piezoelectric component of preferred embodiments of the present invention, the wiring preferably includes a capacitor or an inductor. With this configuration, a capacitor or an inductor need not be independently provided, and thus the piezoelectric component is miniaturized.

Preferably, a protective film is provided in the second opening. With this configuration, the vibrating portion is more reliably protected.

Also, the second opening is preferably covered by a lid. With this configuration, the vibrating portion is more reliably protected.

The piezoelectric element may be a SAW element including a vibrating portion having an IDT formed on a substrate.

Alternatively, the piezoelectric element may be a piezoelectric thin-film element including a vibrating portion provided by sandwiching the upper and lower surfaces of a thin-film portion having at least a layer of piezoelectric thin-film provided on an opening or a recessed portion in a substrate by at least a pair of upper and lower electrodes facing each other.

Alternatively, the piezoelectric element may be a piezoelectric thin-film element including a vibrating portion provided by sandwiching the upper and lower surfaces of a thin-film portion having at least a layer of piezoelectric thin-film provided on a substrate by at least a pair of upper and lower electrodes facing each other, a space being provided between the substrate and the lower electrode in the vibrating portion.

According to another preferred embodiment of the present invention, a method for manufacturing a piezoelectric component including a piezoelectric element including at least one vibrating portion and an element wiring connected to the vibrating portion, which are formed on a substrate, and an external terminal, includes a step of manufacturing the piezoelectric element by forming the at least one vibrating portion and the element wiring connected to the vibrating portion on the substrate, a step of forming an insulating layer including an opening defining a space for protecting the vibrating portion and a conductive opening, a step of forming a first wiring so as to be connected to the element wiring through the conductive opening, and a step of forming the external terminal so as to be connected to the first wiring.

The piezoelectric element may be a SAW element including a vibrating portion having an IDT provided on a substrate.

According to the above-described method, the vibrating portion is protected by the opening defining the space for protecting the vibrating portion in the insulating layer. Therefore, degradation in the characteristic of the piezoelectric component due to packaging is prevented. Also, the piezoelectric component does not require an element which increases the thickness of the piezoelectric component, such as a substrate provided to protect the vibrating portion, and thus, miniaturization, lower profile, and lower cost of the piezoelectric component is achieved. Further, the position of the external terminal connected to the conductive opening can be arbitrarily changed on the insulating layer in accordance with an externally connected circuit. That is, the positioning freedom of the external terminal is increased.

Another preferred embodiment of the present invention provides a method for manufacturing a piezoelectric component including a piezoelectric element including at least one vibrating portion and an element wiring connected to the vibrating portion, which are formed on a substrate, and an external terminal. The method includes a step of manufacturing the piezoelectric element by forming the at least one vibrating portion and the element wiring connected to the vibrating portion on the substrate, a step of forming a protective layer for protecting the vibrating portion in the piezoelectric element, a step of forming an insulating layer including an opening defining a space for protecting the vibrating portion and a conductive opening, a step of forming a first wiring so as to be connected to the element wiring through the conductive opening, and a step of forming the external terminal so as to be connected to the first wiring.

The piezoelectric element may be a SAW element including a vibrating portion having an IDT formed on a substrate.

Alternatively, the piezoelectric element may be a piezoelectric thin-film element including a vibrating portion formed by sandwiching the upper and lower surfaces of a thin-film portion having at least a layer of piezoelectric thin-film provided on an opening or a recessed portion in a substrate by at least a pair of upper and lower electrodes facing each other.

Alternatively, the piezoelectric element may be a piezoelectric thin-film element including a vibrating portion formed by sandwiching the upper and lower surfaces of a thin-film portion having at least a layer of piezoelectric thin-film provided on a substrate by at least a pair of upper and lower electrodes facing each other, a space being provided between the substrate and the lower electrode in the vibrating portion.

According to the above-described method, the vibrating portion is protected by the protective film. Also, the vibrating portion is protected by the opening defining a space for protecting the vibrating portion in the insulating layer. Therefore, degradation in the characteristic of the piezoelectric filter due to packaging is prevented. Also, the piezoelectric component does not require an element causing an increase in the thickness of the piezoelectric component, such as a substrate facing the vibrating portion for protecting the vibrating portion, and thus, miniaturization, lower profile, and lower cost of the piezoelectric component is achieved. Further, the position of the external terminal connected to the conductive opening can be arbitrarily changed on the insulating layer in accordance with an externally connected circuit. That is, the positioning freedom of the external terminal can be increased.

Further, another preferred embodiment of the present invention provides a method for manufacturing a piezoelectric component including a piezoelectric element including at least one vibrating portion and an element wiring connected to the vibrating portion, which are formed on a substrate, and an external terminal. The method includes a step of manufacturing the piezoelectric element by forming the at least one vibrating portion and the element wiring connected to the vibrating portion on the substrate, a step of forming an insulating layer including an opening defining a space for protecting the vibrating portion and a conductive opening, a step of forming a first wiring so as to be connected to the element wiring through the conductive opening, a step of forming a second insulating layer including a second conductive opening on the insulating layer, a step of forming a second wiring so as to be connected to the first wiring through the second conductive opening, and a step of forming the external terminal so as to be connected to the first wiring through the second wiring.

Also, yet another preferred embodiment of the present invention provides a method for manufacturing a piezoelectric component including a piezoelectric element including at least one vibrating portion and an element wiring connected to the vibrating portion, which are formed on a substrate, and an external terminal. The method includes a step of manufacturing the piezoelectric element by forming the at least one vibrating portion and the element wiring connected to the vibrating portion on the substrate, a step of forming a protective layer for protecting the vibrating portion in the piezoelectric element, a step of forming an insulating layer including an opening defining a space for protecting the vibrating portion and a conductive opening, a step of forming a first wiring so as to be connected to the element wiring through the conductive opening, a step of forming a second insulating layer including a second conductive opening on the insulating layer, a step of forming a second wiring so as to be connected to the first wiring through the second conductive opening, and a step of forming the external terminal so as to be connected to the first wiring through the second wiring.

According to the above-described method, the first wiring is protected by the second insulating layer, and thus, short circuiting caused by contact with the first wiring at packaging of the piezoelectric component is effectively prevented.

Preferably, the method further includes a step of polishing the piezoelectric substrate.

According to the above-described method, the piezoelectric substrate can be thinned by polishing it. Preferably, the polishing step is performed after the insulating layer is formed so as to reinforce the piezoelectric substrate. By this polishing step, the profile of the SAW device is further reduced.

In the piezoelectric component of various preferred embodiments of the present invention, the vibrating portion in the piezoelectric element is protected by a protective layer or a protective space forming member. Accordingly, degradation in the characteristics of the piezoelectric component due to packaging is prevented. Also, the piezoelectric component does not require an element causing an increase in the thickness of the piezoelectric component, such as a substrate facing the vibrating portion for protecting the vibrating portion, and thus miniaturization, lower profile, and lower cost of the piezoelectric component is achieved.

Other features, elements, characteristics, steps and advantages of the present invention will become more apparent from the following detailed description of preferred embodiments with reference to the attached drawings.

DETAILED DESCRIPTION OF PREFERRED EMBODIMENTS

First Preferred Embodiment

Hereinafter, a preferred embodiment of the present invention will be described with reference to FIGS. 1 and 4 to 12.

Figure 1:
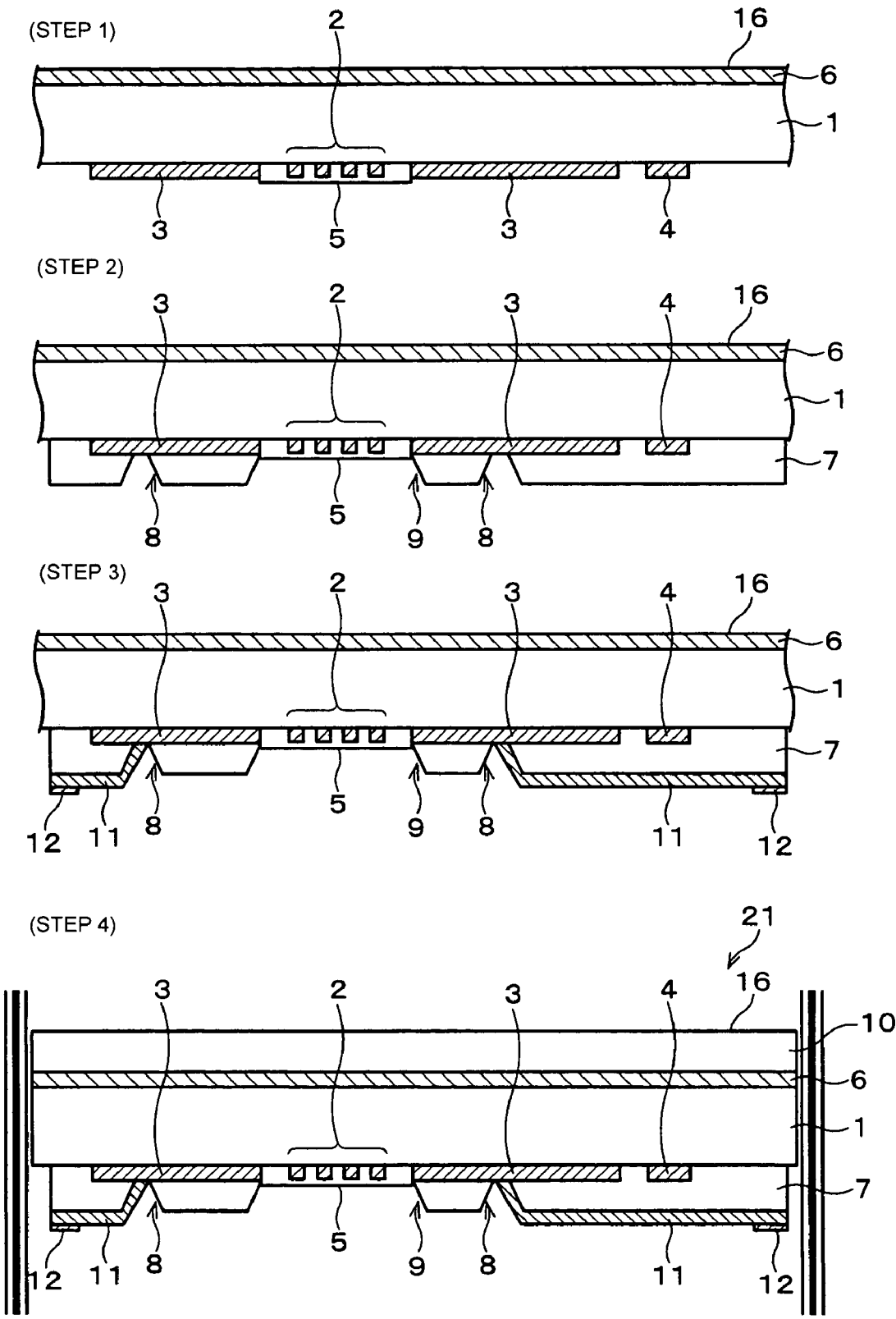
FIG. 1 includes cross-sectional views showing a process of manufacturing a SAW device according to a first preferred embodiment of the present invention.

As shown in FIG. 1, a SAW filter according to this preferred embodiment includes a SAW element (piezoelectric element) 16 including at least one IDT (vibrating portion) 2 and a conductive pad (element wiring) 3 connected to the IDT 2, which are disposed on a piezoelectric substrate 1 including LiTaO$_3$, and an external terminal 12 connected to the conductive pad 3. The external terminal 12 is connected to the conductive pad 3 through a wiring (external terminal connecting member, first wiring) 11 extending in a conductive opening 8 in an insulating layer 7, which is laminated on the conductive pad 3 and which includes resin. The conductive opening 8 corresponds to a portion where the insulating layer is not disposed on the conductive pad 3. Also, an exciting portion protective opening 9, which defines a space for protecting a SAW-exciting portion including the IDT 2, is provided in the insulating layer 7. The exciting portion protective opening 9 corresponds to a portion where the insulating layer is not provided for the SAW-exciting portion including the IDT 2 on the LiTaO$_3$ piezoelectric substrate 1, that is, a portion where a protective film (protective layer) 5 is provided.

In the above-described configuration, the SAW-exciting portion including the IDT 2 is protected by the protective film 5. Further, the IDT 2 is protected by the exciting portion protective opening 9 in the insulating layer 7. With this configuration, degradation in the characteristics of the SAW filter due to packaging is prevented. Also, the above-described SAW filter does not require an element causing an increase in the thickness of the SAW filter, such as a substrate provided for protecting the SAW-exciting portion including the IDT 2, and thus miniaturization, lower profile, and lower cost of the SAW filter are achieved. That is, the size of the packaging is approximately the size of the SAW element 16 or a chip.

Further, since the wiring 11 extending in the conductive opening 8 can be arbitrarily arranged, the position of the external terminal 12 connected to the wiring 11 can be arbitrarily changed in accordance with an externally connected circuit. That is, the positioning freedom of the external terminal 12 is increased.

The IDT 2 and the conductive pad 3 include Al, for example, and a layer including Ti, Ni, or Au may be laminated as necessary. Preferably, corrosion is suppressed by providing Au as a top layer.

SiN or SiO$_2$ may be used for the protective film 5.

Even if the protective film 5 is not provided, reliability is ensured to some extent.

The insulating layer 7 includes an ordinary photoresist including photosensitive polyimide or a novolac resin, or an insulating material such as photosensitive benzocyclobuten. Alternatively, benzocyclobuten, a cyclic olefin resin, or an epoxy resin can be used.

A protective metallic film 6 is preferably disposed on the surface opposite to the surface provided with the IDT 2 of the LiTaO$_3$ piezoelectric substrate 1. Accordingly, any effects of external electromagnetic waves on the SAW filter are reliably prevented by this protective metallic film 6. The protective metallic film 6 preferably includes a material for blocking electromagnetic waves, such as Ti, Al, or NiCr.

Also, a buffer layer 10 is preferably disposed on the protective metallic film 6. When the protective metallic film is not provided, the buffer layer 10 may be provided directly on the LiTaO$_3$ piezoelectric substrate 1. The buffer layer 10 absorbs impacts caused during packaging of the SAW filter. The buffer layer 10 may include a conductive or non-conductive resin. However, a conductive resin is preferably used, for example, an epoxy resin containing Ag particles. In this manner, by applying conductivity, effects of external electromagnetic waves are prevented. In addition, pyroelectric destruction of the IDT on the pyroelectric LiTaO$_3$ substrate is prevented.

In the SAW filter, a reinforcing substrate such as an alumina substrate is preferably disposed on the surface opposite to the surface provided with the IDT 2 of the LiTaO$_3$ piezoelectric substrate 1. This reinforcing substrate is bonded to the surface opposite to the surface provided with the IDT 2 of the LiTaO$_3$ piezoelectric substrate 1 using an adhesive or other suitable bonding material. The reinforcing substrate improves the strength of the SAW filter.

Next, a method for manufacturing the SAW filter will be described with reference to FIG. 1.

First, in step 1, the IDT 2, the conductive pad 3, a reflector (not shown), and a wiring (element wiring) (not shown) are provided on the 100 mmφ LiTaO$_3$ substrate (piezoelectric substrate) 1 having a thickness of about 0.35 mm. That is, the IDT 2, the conductive pad 3, the reflector, and the wiring are preferably formed on the LiTaO$_3$ piezoelectric substrate 1 by a lift-off method such as evaporation by using Al. Further, an alignment mark 4 for positioning is preferably formed. Although the shape and size of the alignment mark 4 are not specified, it is preferably substantially circular-shaped and has a size of, for example, about 10 μmφ in this case. Further, the protective film 5 including SiN or SiO$_2$ is formed at the portion provided with the IDT 2 and the reflector, that is, at the SAW-exciting portion including the IDT 2, by sputtering or other suitable method, so as to have a thickness of, for example, about 5 nm. The protective metallic film 6 including Ti or other suitable material is preferably formed on the surface opposite to the surface provided with the IDT 2 of the LiTaO$_3$ piezoelectric substrate 1. The protective metallic film 6 may be arbitrarily formed as necessary.

Then, in step 2, the insulating layer 7 having the conductive opening 8 and the exciting portion protective opening 9 is formed on the surface provided with the IDT 2 of the LiTaO$_3$ piezoelectric substrate 1. The insulating layer 7 can be formed by, for example, applying photosensitive polyimide in a thickness of about 15 μm, and then performing exposure and development in accordance with a predetermined pattern so as to form the conductive opening 8 and the exciting portion protective opening 9.

Then, in step 3, the wiring 11 and the external terminal 12 are formed. The wiring 11 and the external terminal 12 can be formed by, for example, forming a resist pattern to be lifted off, forming a metallic film by laminating Au (200 nm), Pd (100 nm), and Ti (100 nm) in that order by evaporation, and then lifting off the resist. Alternatively, the wiring 11 and the external terminal 12 may be formed by filling a conductive paste in the conductive opening 8 or printing it in a sufficient thickness, and then firing the conductive paste. As the conductive paste, a resin Ag paste, a solder paste, an Sn paste which can be sintered at a low temperature, or a Zn paste may be used. Also, the wiring 11 and the external terminal 12 may be formed by forming a metallic film and etching the film. In the above-described forming methods, the wiring 11 and the external terminal 12 can be formed at the same time so as to simplify the manufacturing process. Alternatively, the wiring 11 and the external terminal 12 may be formed by filling a conductive paste in the conductive opening 8 and sintering it, and then performing evaporation or printing of the conductive paste so as to be connected to the sintered conductive paste.

Then, in step 4, the buffer layer 10 is formed on the protective metallic film 6 so as to alleviate impact of packaging. The buffer layer 10 may not be formed. When the buffer layer 10 is formed by using a conductive resin, the protective metallic film 6 is not necessary. Further, in this step, the strength of the SAW filter may be enhanced by bonding a reinforcing substrate. Finally, the produced substrate is diced at predetermined positions so that a SAW filter 21 can be obtained. Although only one SAW element 16 is shown in FIG. 1, a plurality of SAW elements may be formed.

According to the above-described method, the SAW-exciting portion including the IDT 2 is protected by the protective film 5. Further, the IDT 2 is be protected by a space defined by the exciting portion protective opening 9 in the insulating layer 7. Therefore, degradation in the characteristic of the SAW filter due to packaging is prevented. Also, in the above-described SAW filter, an element which causes an increase in the thickness of the SAW filter, such as a substrate facing the IDT 2 for protecting the SAW-exciting portion including the IDT 2, is not required. Accordingly, miniaturization, lower profile, and lower cost of the SAW filter are achieved. Further, the steps of bonding substrates facing each other and etching of the substrates are reduced, and thus, the manufacture of the SAW filter is simplified and the manufacturing time is reduced.

Preferably, the conductive opening 8 is substantially tapered by setting appropriate exposure conditions. Accordingly, the wiring 11 at the conductive opening 8 is more easily formed and thus, the SAW filter is more easily formed.

If the protective metallic film 6 is not formed, the LiTaO$_3$ piezoelectric substrate 1 may be polished so as to reduce its thickness in step 2 or thereafter. This polishing step can be performed because the LiTaO$_3$ piezoelectric substrate 1 is reinforced by forming the insulating layer 7. In this manner, a lower-profile SAW filter is obtained.

Preferably, a negative resist is used for each resist pattern. By using a negative resist, remaining resist at the opening is prevented.

In the insulating layer 7, a dicing opening is preferably formed at a dicing portion of the SAW filter. By using this dicing opening, positioning for dicing is easily performed, and clogging during dicing is prevented. Preferably, the width of the dicing opening is equal to the width of a dicing blade used for dicing. Accordingiy, a protruded portion of a product after dicing is prevented from being damaged.

Next, a SAW filter according to a modification of this preferred embodiment will be described with reference to FIGS. 4 to 8.

Figure 4:
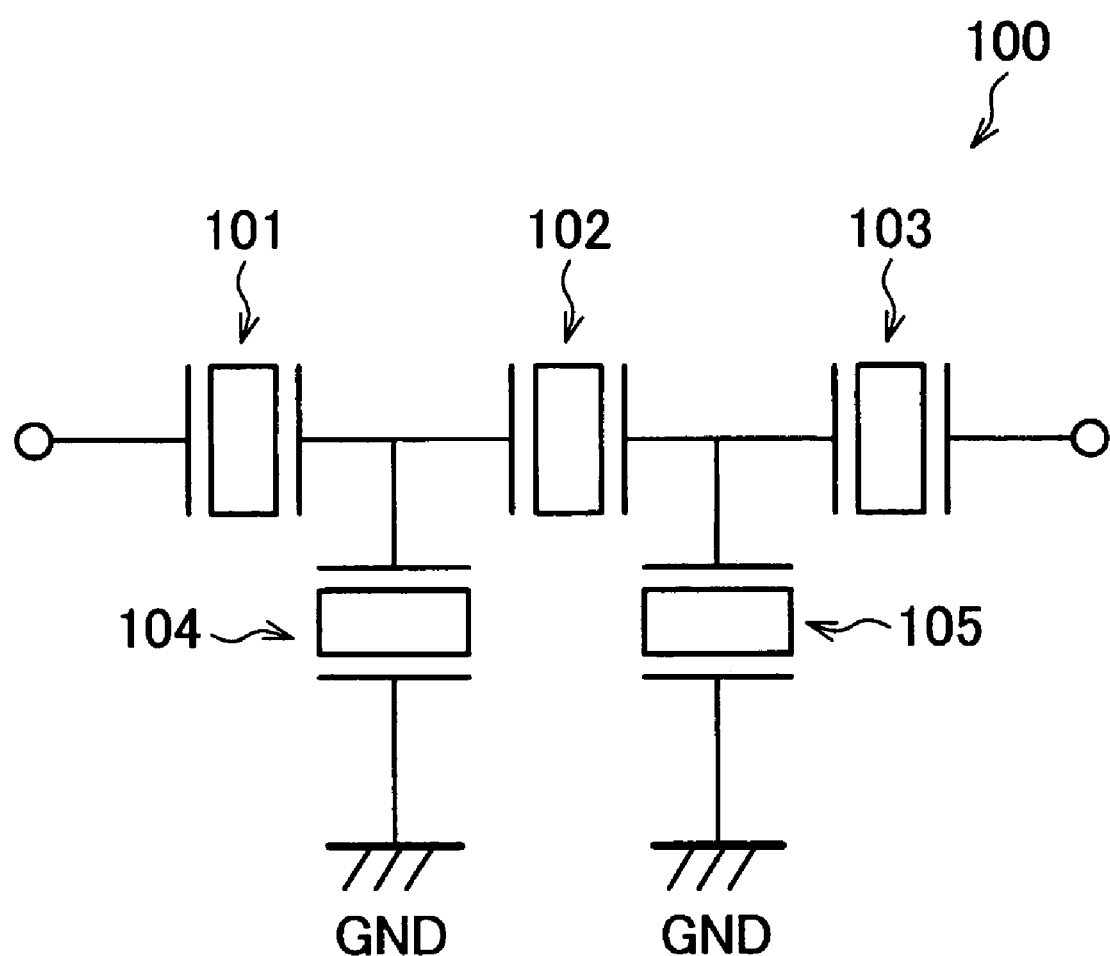
FIG. 4 is a circuit diagram showing a SAW device according to a modification of the first preferred embodiment of the present invention.

FIG. 4 is a circuit diagram showing a SAW filter 100 of this modification. The SAW filter 100 includes SAW resonators 101 to 105 arranged in a ladder pattern, each resonator having an IDT (vibrating portion). The SAW resonators 101 to 103 are series resonators and the SAW resonators 104 and 105 are parallel resonators.

Hereinafter, the SAW filter 100 will be described with reference to FIGS. 5 to 8.

Figure 5:
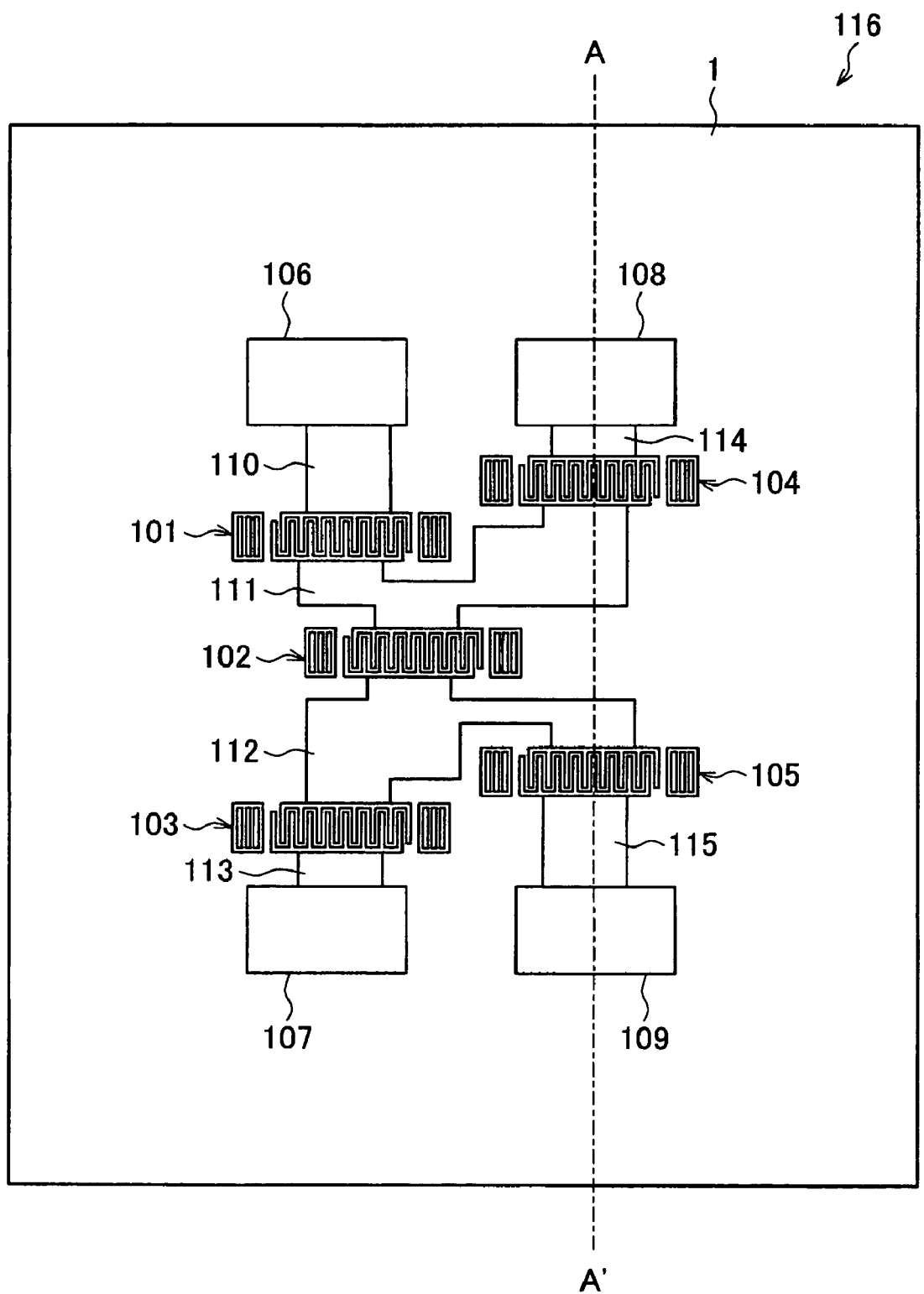
FIG. 5 is a plan view showing a SAW element of the SAW device according to the modification of the first preferred embodiment of the present invention.

As shown in FIG. 5, the SAW resonators 101 to 105, conductive pads (element wirings) 106 to 109, and wirings (element wirings) 110 to 115 are provided on the piezoelectric substrate 1 so as to define a SAW element 116. Also, a protective film (not shown) for protecting the SAW resonators 101 to 105 is provided.

Figure 6:
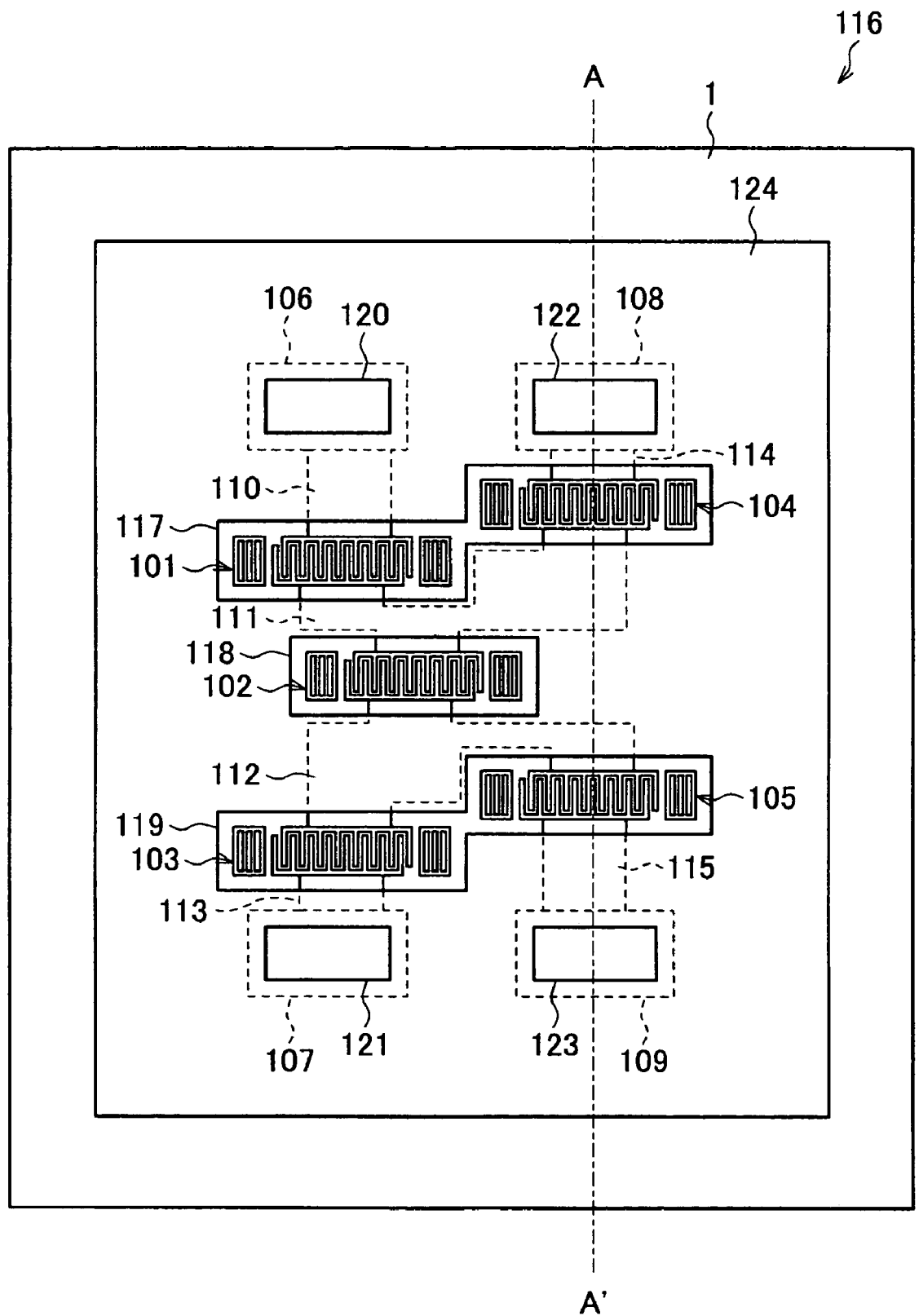
FIG. 6 is a plan view showing a state where an insulating layer is formed on the SAW element shown in FIG. 5.

Then, as shown in FIG. 6, an insulating layer 124 is provided on the SAW element 116. The insulating layer 124 includes exciting portion protective openings 117 to 119 for exposing the SAW resonators 101 to 105 and conductive openings 120 to 123 for exposing the conductive pads 106 to 109. Alternatively, the insulating layer 124 may cover substantially the entire surface of the piezoelectric substrate 1.

Figure 7:
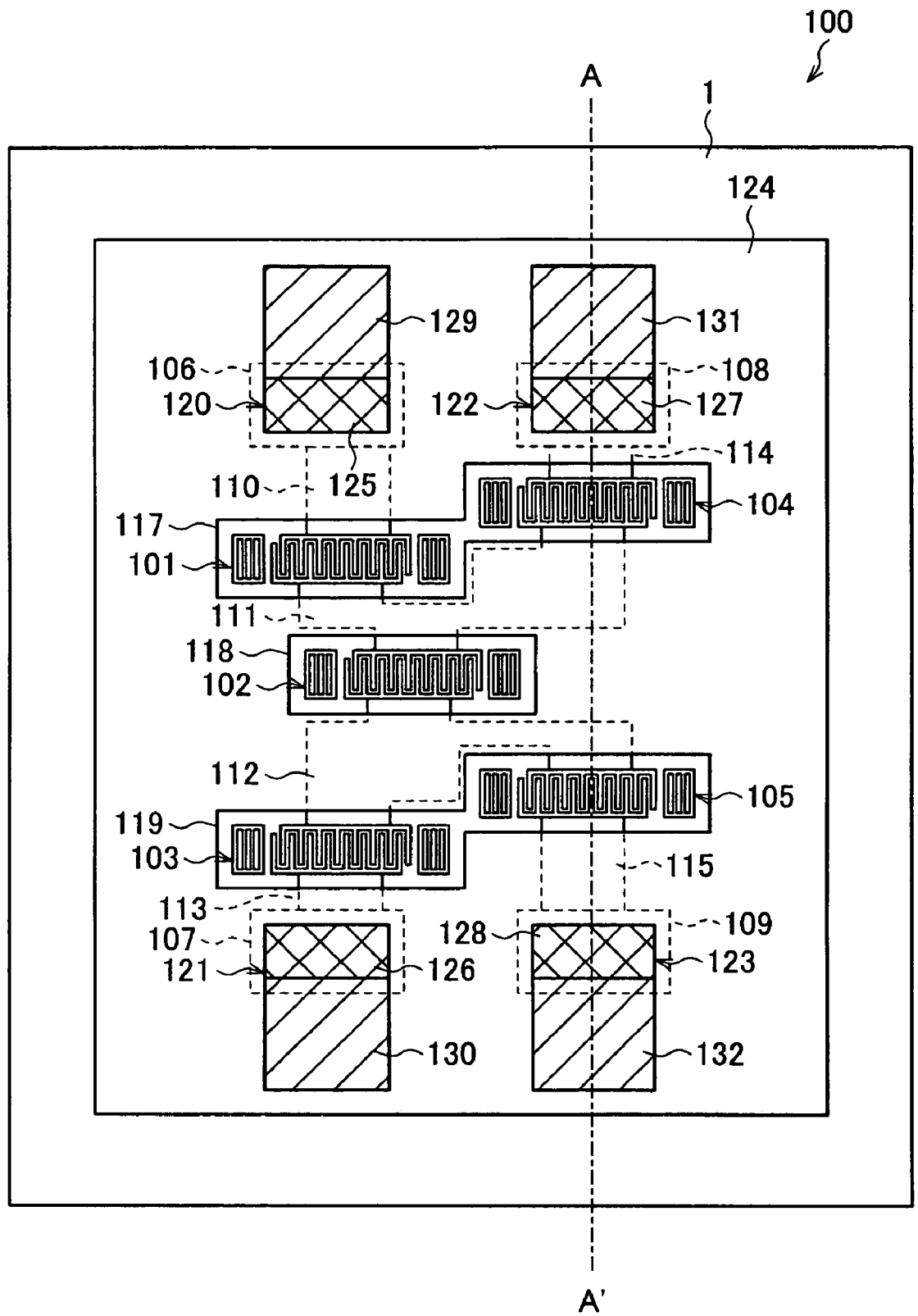
FIG. 7 is a plan view showing a state where external terminals are formed on the insulating layer shown in FIG. 6.

Then, as shown in FIG. 7, external terminal connecting members (first wirings) 125 to 128 connected to the conductive pads 106 to 109 through the conductive openings 120 to 123 and externals terminals 129 to 132 connected to the external terminal connecting members 125 to 128 are provided on the insulating layer 124, so as to obtain the SAW filter 100.

Figure 8:
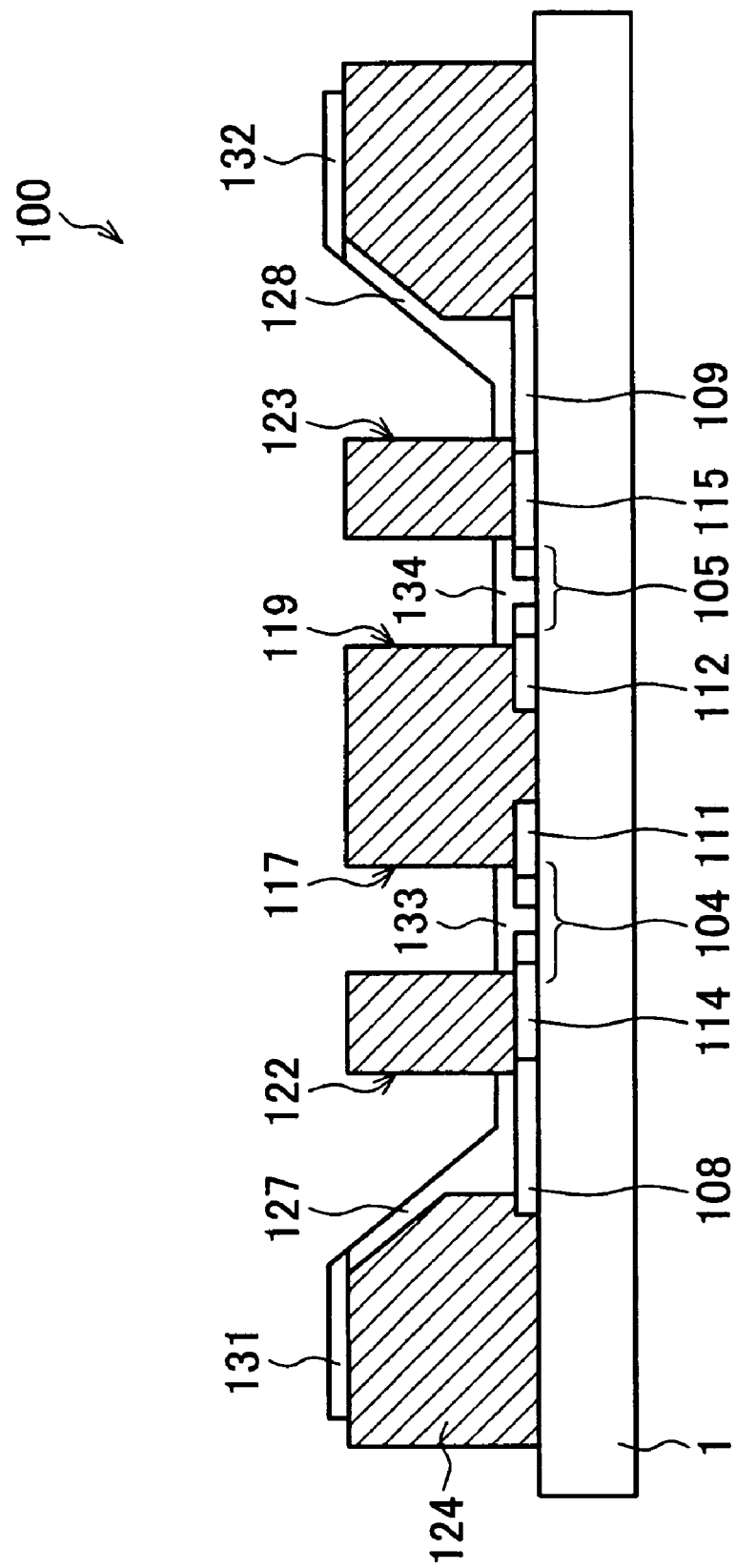
FIG. 8 is a cross-sectional view showing the SAW device according to the modification of the first preferred embodiment of the present invention.

FIG. 8 is a cross-sectional view of the produced SAW filter 100, taken along the line A–A' in FIGS. 5 to 7.

As shown in FIG. 8, in the SAW filter 100, the exciting portions including the IDTs of the SAW resonators are protected by the exciting portion protective openings 117 and 119. Also, the IDTs of the SAW resonators are protected by protective films 133 and 134. Furthermore, the exciting portion protective openings 117 and 119 may be covered by a lid so as to prevent conductive particles from contacting the IDTs. Accordingly, degradation in the characteristic of the SAW filter is prevented.

Next, a SAW filter according to another modification of this preferred embodiment will be described with reference to FIGS. 9 to 12.

Figure 9:
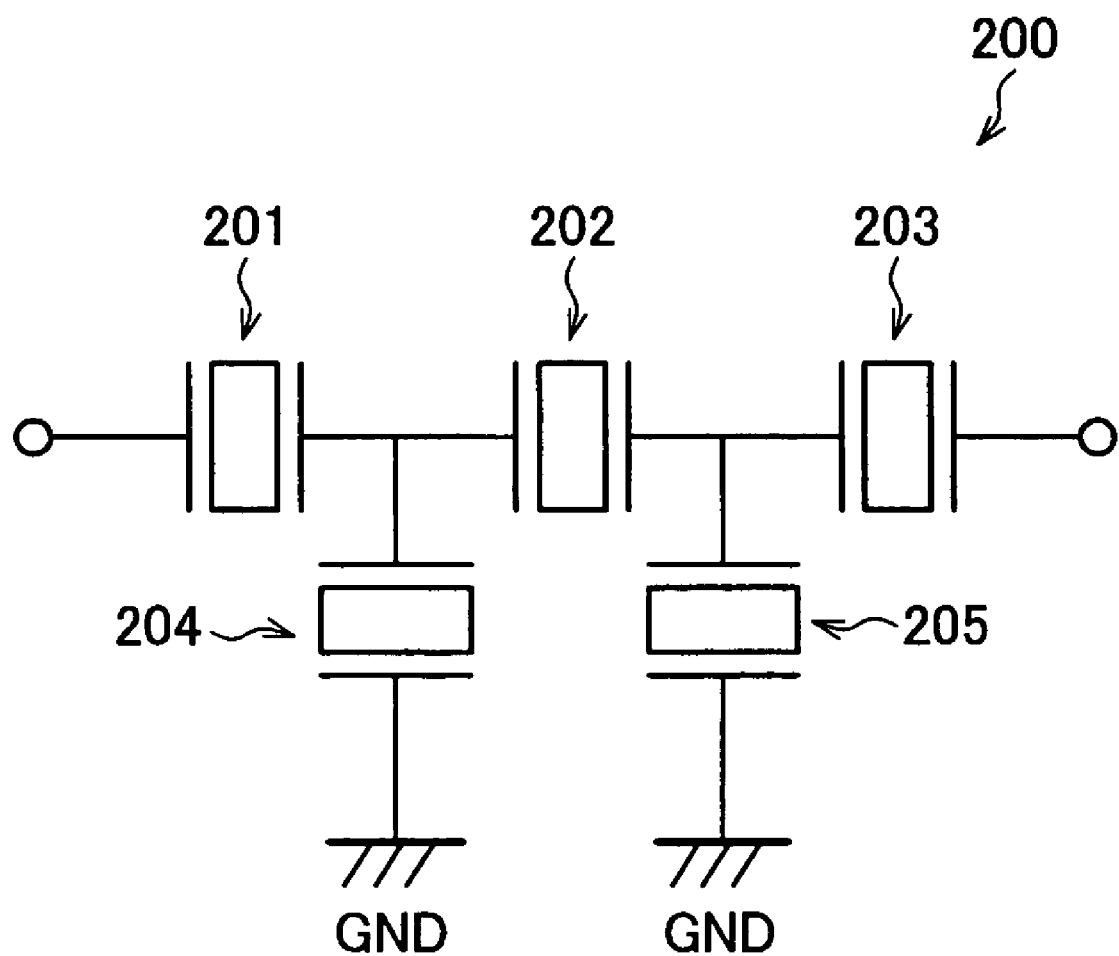
FIG. 9 is a circuit diagram showing a SAW device according to another modification of the first preferred embodiment of the present invention.

FIG. 9 is a circuit diagram showing a SAW filter 200 of this modification. The SAW filter 200 includes SAW resonators 201 to 205 arranged in a ladder pattern, each resonator having an IDT (vibrating portion). The SAW resonators 201 to 203 are series resonators and the SAW resonators 204 and 205 are parallel resonators.

Hereinafter, a method for manufacturing the SAW filter 200 will be described with reference to FIGS. 10 to 12.

Figure 10:
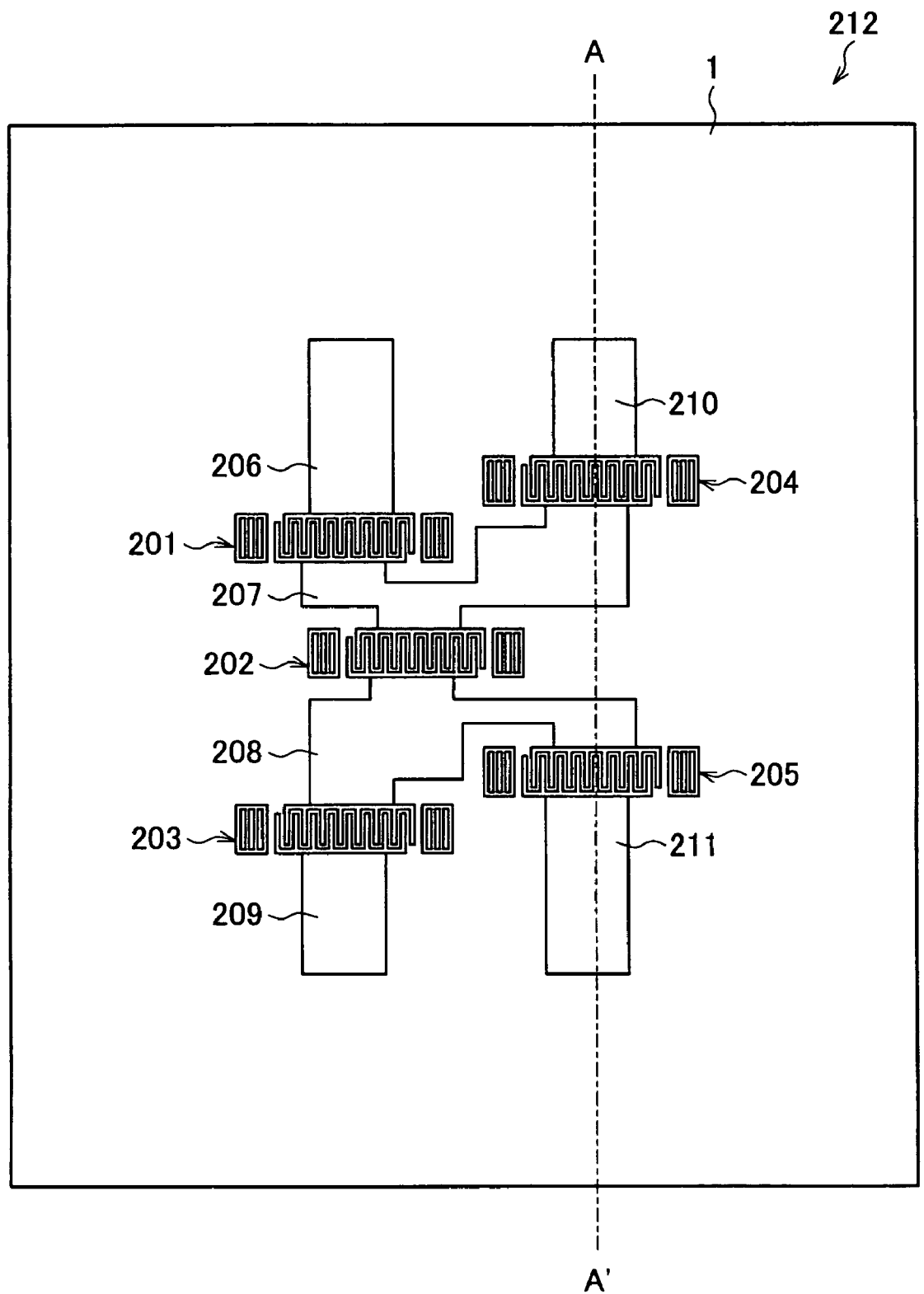
FIG. 10 is a plan view showing a SAW element of the SAW device according to the above-described another modification of the first preferred embodiment of the present invention.

First, as shown in FIG. 10, the SAW resonators 201 to 205 and wirings (element wirings) 206 to 211 are formed on the piezoelectric substrate 1 so as to form a SAW element 212.

Figure 11:
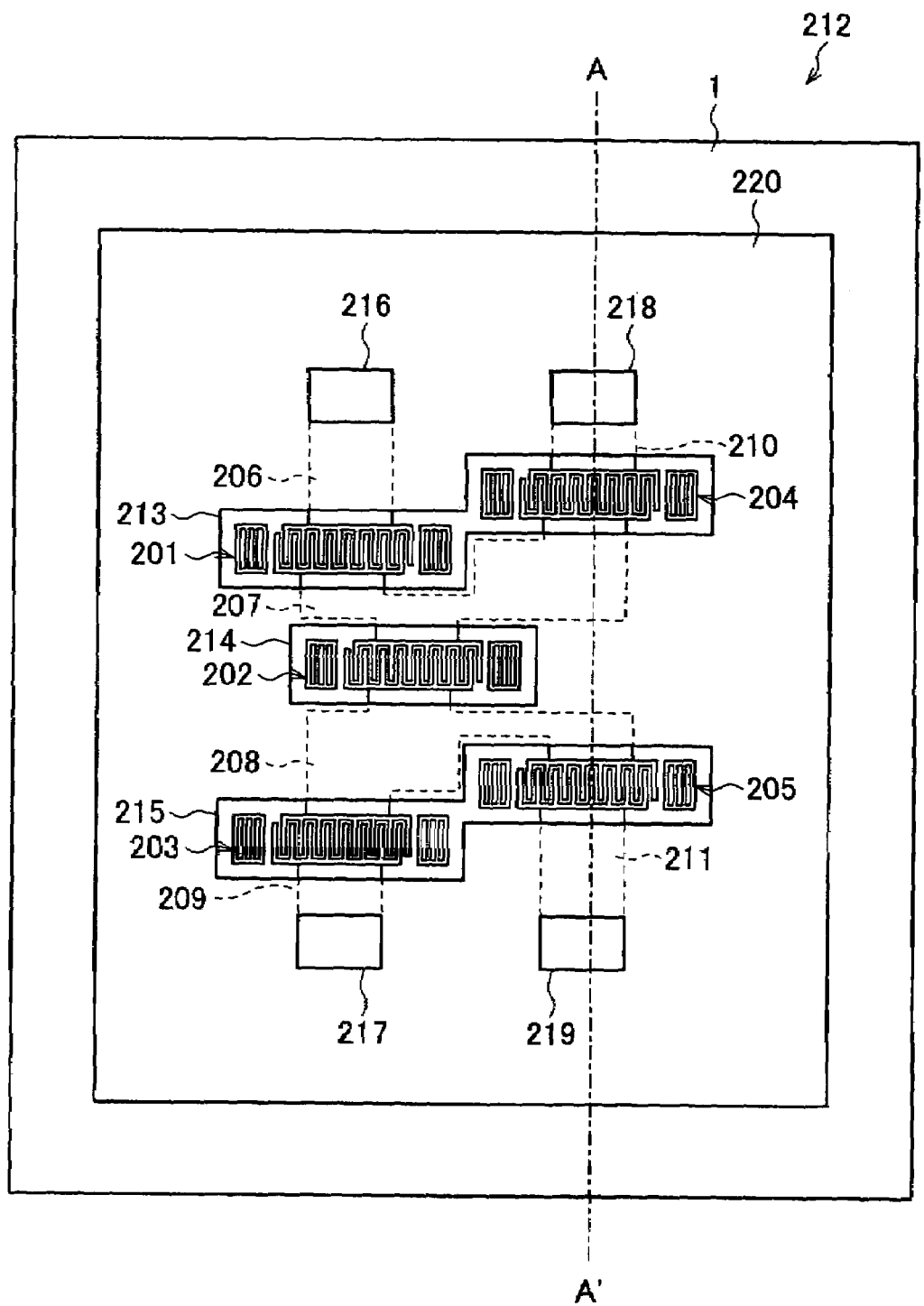
FIG. 11 is a plan view showing a state where an insulating layer is formed on the SAW element shown in FIG. 10.

Then, as shown in FIG. 11, an insulating layer 220 is formed on the SAW element 212. The insulating layer 220 includes exciting portion protective openings 213 to 215 for exposing the SAW resonators 201 to 205 and conductive openings 216 to 219 for exposing end portions of the wirings 206 to 211.

Figure 12:
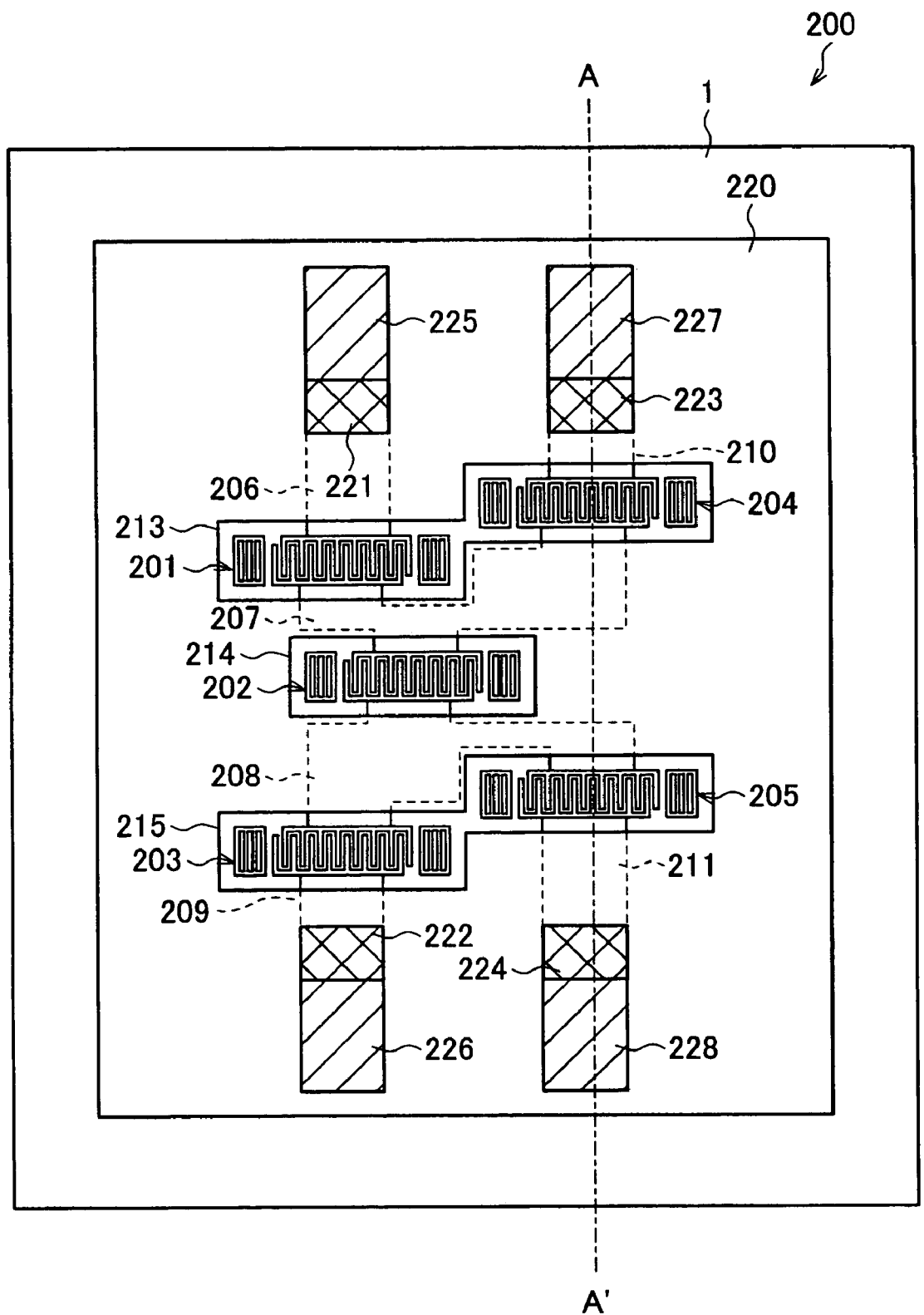
FIG. 12 is a plan view showing a state where external terminals are formed on the insulating layer shown in FIG. 11.

Then, as shown in FIG. 12, external terminal connecting members (first wirings) 221 to 224 connected to the wirings 206, 209, 210, and 211 through the conductive openings 216 to 219 and external terminals 225 to 228 connected to the external terminal connecting members 221 to 224 are formed on the insulating layer 220. Further, protective films are formed on the exciting portion protective openings 213 to 215 so as to obtain the SAW filter 200.

In each of the above-described SAW filters, an element wiring is connected to each IDT on the piezoelectric substrate, but a portion of the element wirings can be omitted. In that case, the conductive openings are formed in the insulating layer such that a bus bar of each IDT is exposed.

Accordingly, space for wirings and conductive pads on the piezoelectric substrate is reduced, and thus the SAW filter is further miniaturized.

Second Preferred Embodiment

Hereinafter, another preferred embodiment of the present invention will be described with reference to FIGS. 2 and 3 and 13 to 24. For convenience, elements having the same function as that in the first preferred embodiment are denoted by the same reference numerals, and the corresponding description will be omitted.

Figure 2:
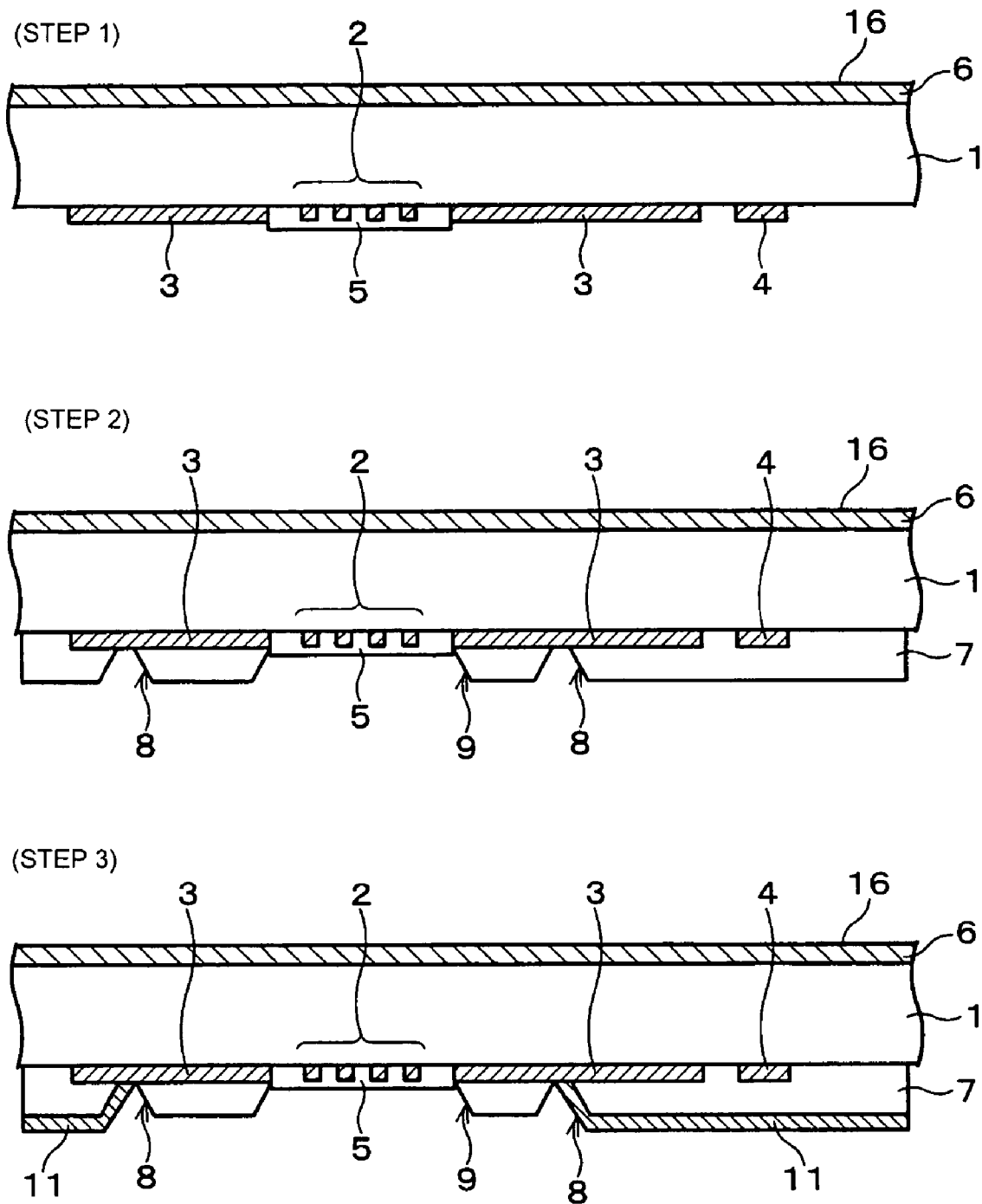
FIG. 2 includes cross-sectional views showing a process of manufacturing a SAW device according to a second preferred embodiment of the present invention.
Figure 3:
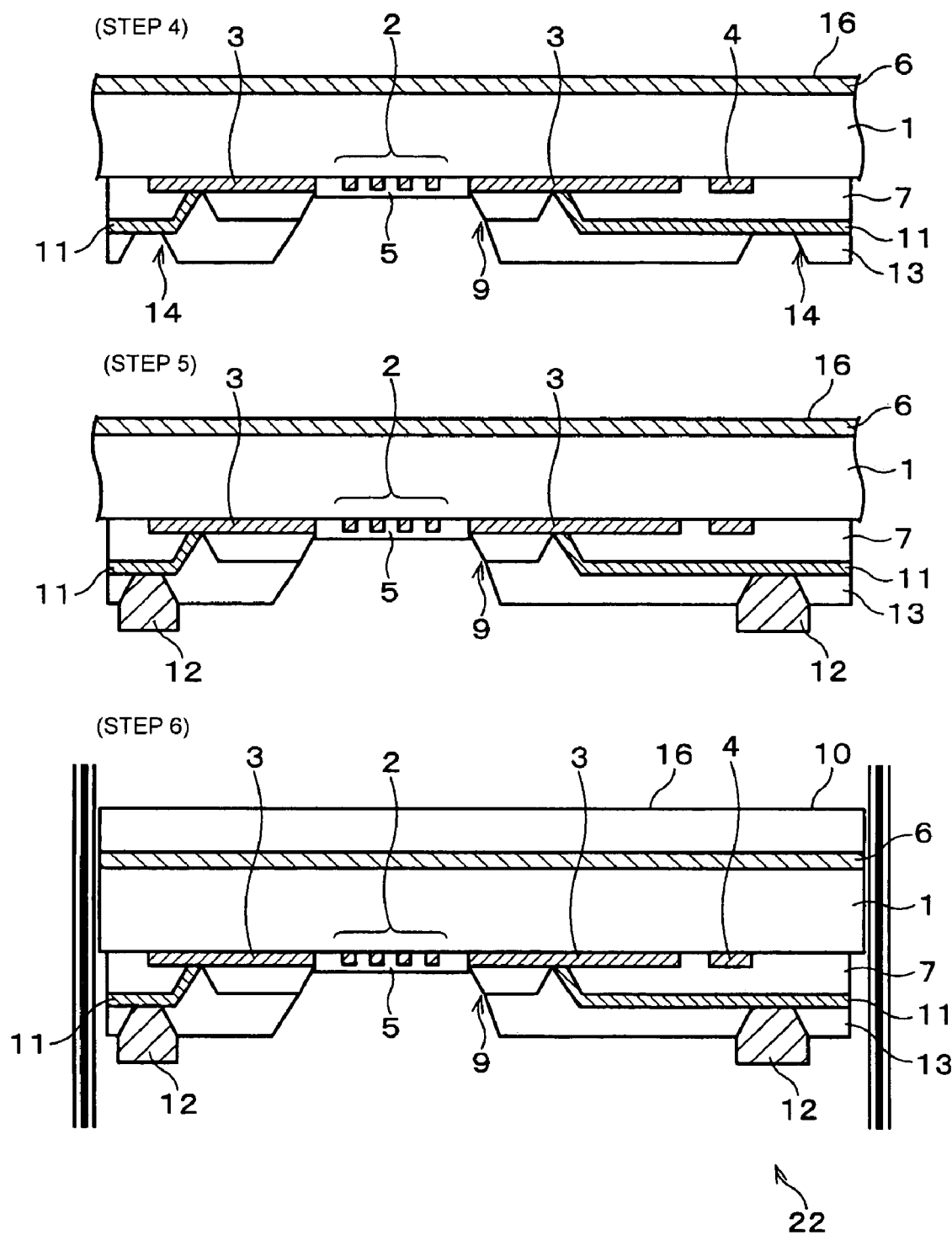
FIG. 3 includes cross-sectional views showing the process of manufacturing the SAW device according to the second preferred embodiment of the present invention.

As shown in FIGS. 2 and 3, a SAW filter according to this preferred embodiment is different from that of the first preferred embodiment in that a wiring protective layer (second insulating layer) 13 for protecting the wiring 11 to be connected to the external terminal 12 is provided. The external terminal 12 is connected to the wiring 11 through a conductive opening (second conductive opening) 14 in the wiring protective layer 13.

Hereinafter, a method for manufacturing the SAW filter will be described with reference to FIGS. 2 and 3.

In this preferred embodiment, steps 1 and 2 are the same as in the first preferred embodiment.

In step 3, only the wiring 11 is formed in this preferred embodiment, whereas the wiring 11 and the external terminal 12 are formed in the first preferred embodiment.

In step 4, the wiring protective layer 13 including the conductive opening 14 and a second opening is formed. In the wiring protective layer 13, the portion of the exciting portion protective opening 9 defines the second opening (second exciting portion protective opening). The wiring protective layer 13 is formed in the same manner as that for the insulating layer 7. For example, the wiring protective layer 13 can be formed by applying photosensitive polyimide and then performing exposure and development in accordance with a predetermined pattern so as to include the conductive opening 14 and the second opening at the exciting portion protective opening 9.

Then, in step 5, the external terminal 12 is formed in the conductive opening 14. The external terminal 12 may be formed in the same manner as in the first preferred embodiment.

Then, in step 6, the buffer layer 10 is formed as in step 4 of the first preferred embodiment, and the produced substrate is diced at predetermined positions, so that a SAW filter 22 is obtained.

As described above, the wiring protective layer 13 is formed on the wiring 11 in this method. Accordingly, short circuiting caused by contact of the external terminal 12 and the wiring 11 at packaging of the SAW filter is prevented.

In this preferred embodiment, the portion provided with the exciting portion protective opening 9 in the wiring protective layer 13 defines the second opening. However, the second opening may be omitted. When the second opening is omitted, the space defined by the exciting portion protective opening 9 in the insulating layer 7 is hollow, such that the space is provided over the SAW-exciting portion including the IDT 2. Accordingly, degradation in the characteristic of the SAW filter due to packaging is prevented. Also, the exciting portion protective opening 9 may be covered by a lid.

The portion of the external terminal 12 formed in the conductive opening 14 defines an external terminal connecting member (second wiring). That is, the external terminal 12 includes an external terminal connecting member and an external terminal. Alternatively, the external terminal connecting member and the external terminal may be separate and each of them may be formed using a different method.

Next, a SAW filter according to a modification of this preferred embodiment will be described with reference to FIGS. 13 to 18.

Figure 13:
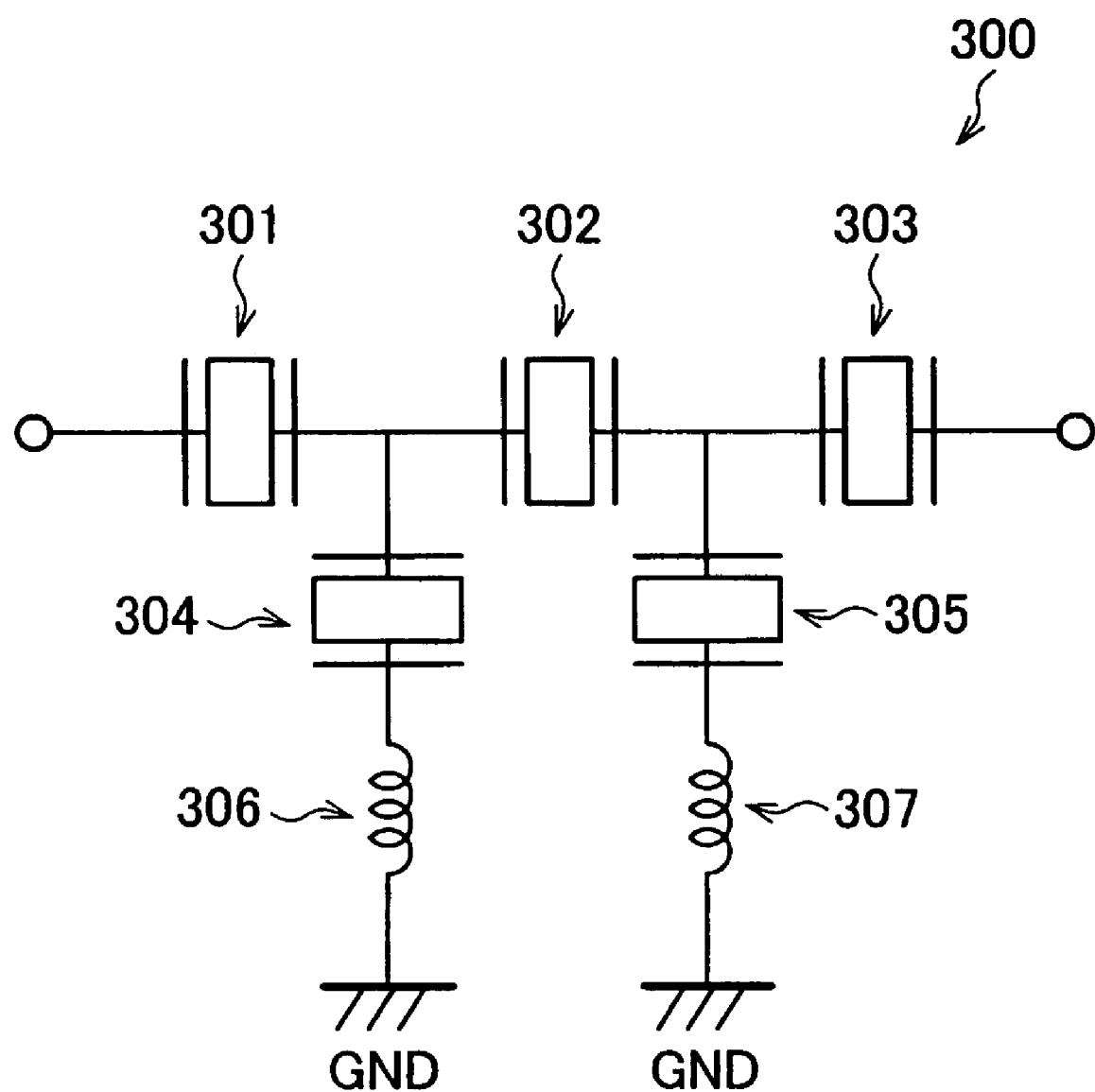
FIG. 13 is a circuit diagram showing a SAW device according to a modification of the second preferred embodiment of the present invention.

FIG. 13 is a circuit diagram showing a SAW filter 300 of this modification. The SAW filter 300 includes SAW resonators 301 to 305 arranged in a ladder configuration, each resonator including an IDT (vibrating portion). The SAW resonators 301 to 303 are series resonators and the SAW resonators 304 and 305 are parallel resonators. Inductors 306 and 307 are connected to the SAW resonators 304 and 305 in series, respectively.

Hereinafter, the SAW filter 300 will be described with reference to FIGS. 14 to 17.

Figure 14:
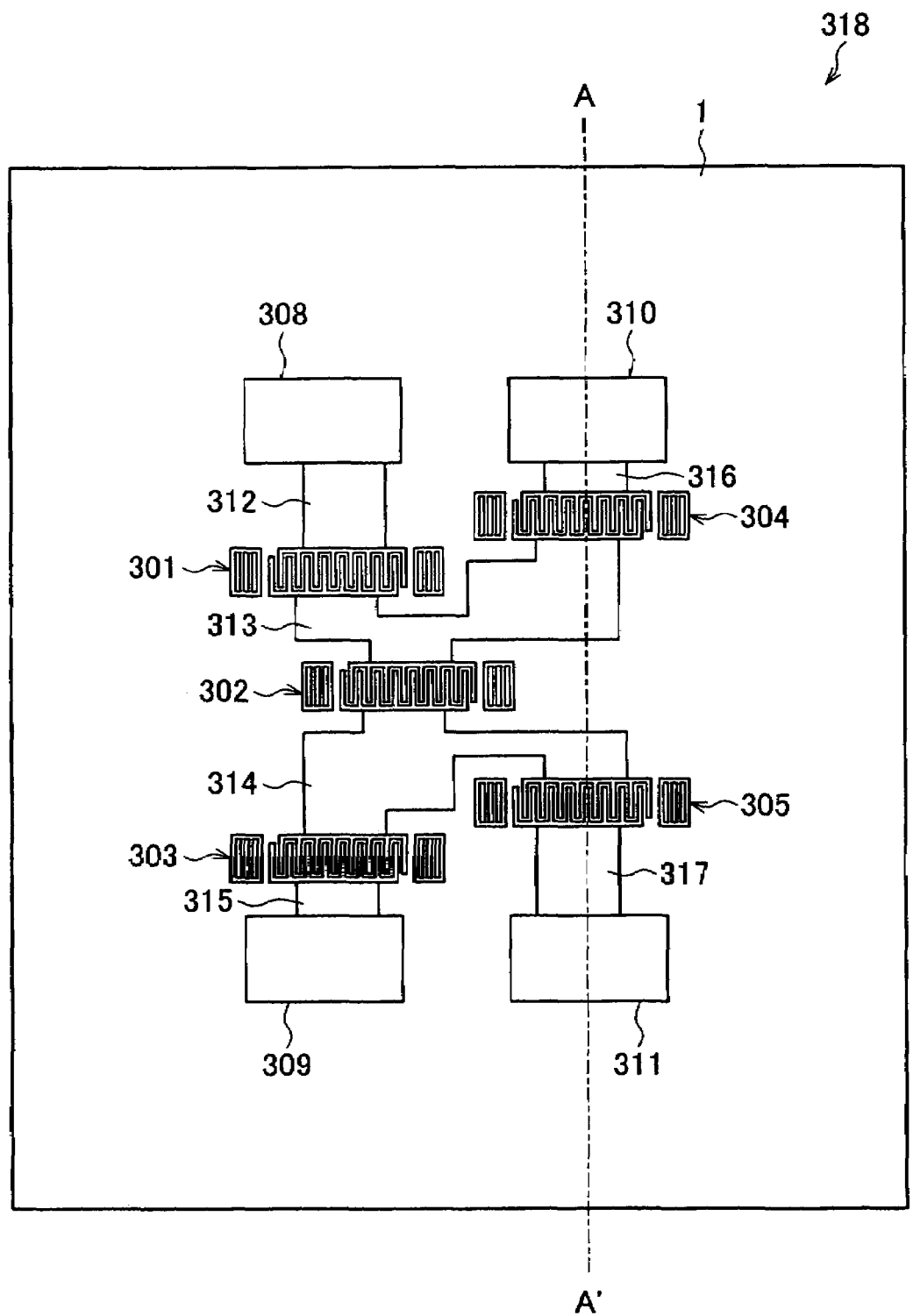
FIG. 14 is a plan view showing a SAW element of the SAW device according to the modification of the second preferred embodiment of the present invention.

First, as shown in FIG. 14, the SAW resonators 301 to 305, conductive pads (element wirings) 308 to 311, and wirings (element wirings) 312 to 317 are formed on the piezoelectric substrate 1 so as to form a SAW element 318.

Figure 15:
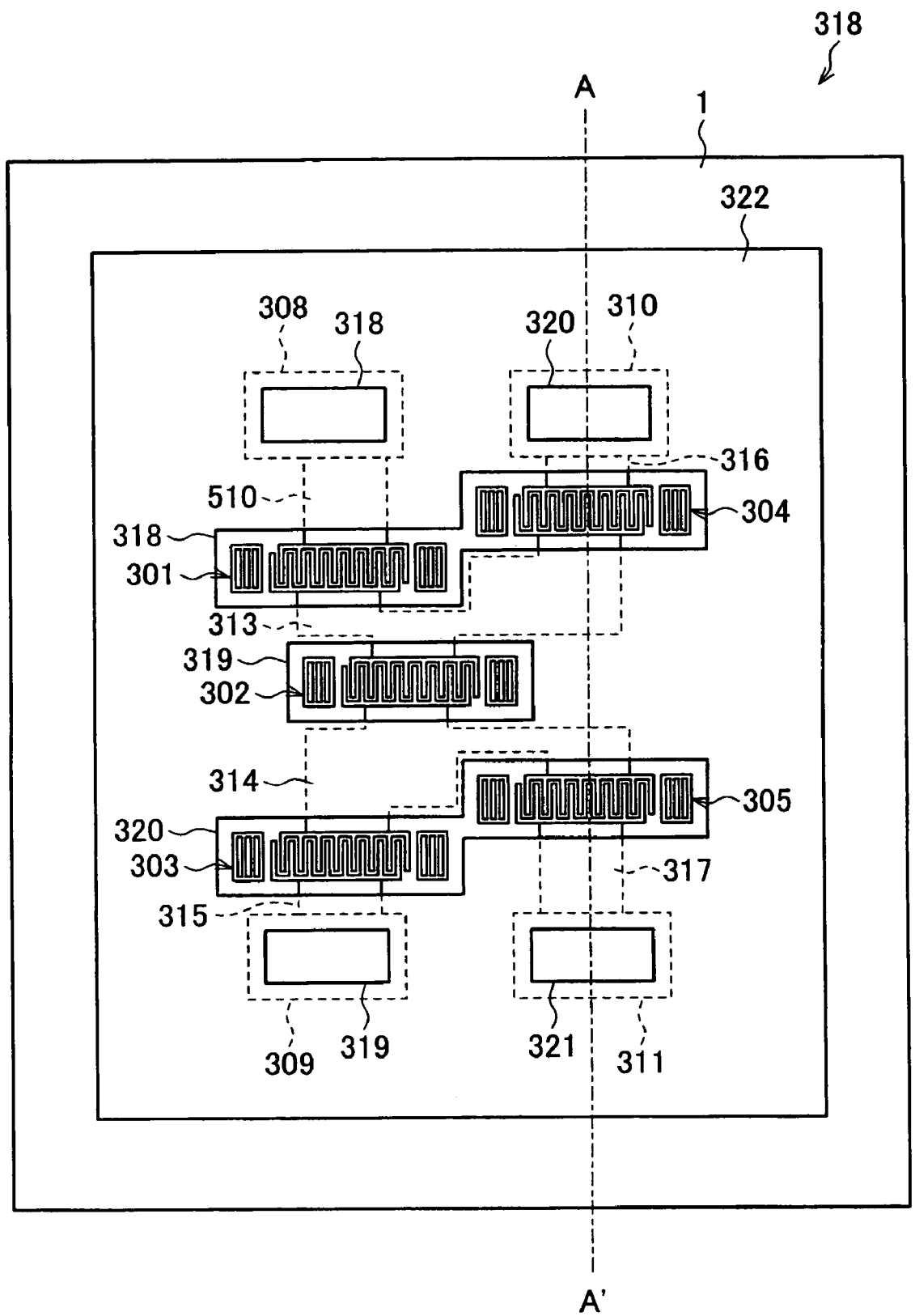
FIG. 15 is a plan view showing a state where an insulating layer is formed on the SAW element shown in FIG. 14.

Then, as shown in FIG. 15, an insulating layer 322 is formed on the SAW element 318. The insulating layer 322 includes exciting portion protective openings 318 to 320 for exposing the SAW resonators 301 to 305 and conductive openings 318 to 321 for exposing the conductive pads 308 to 311. The insulating layer 322 may cover substantially the entire surface of the piezoelectric substrate 1.

Figure 16:
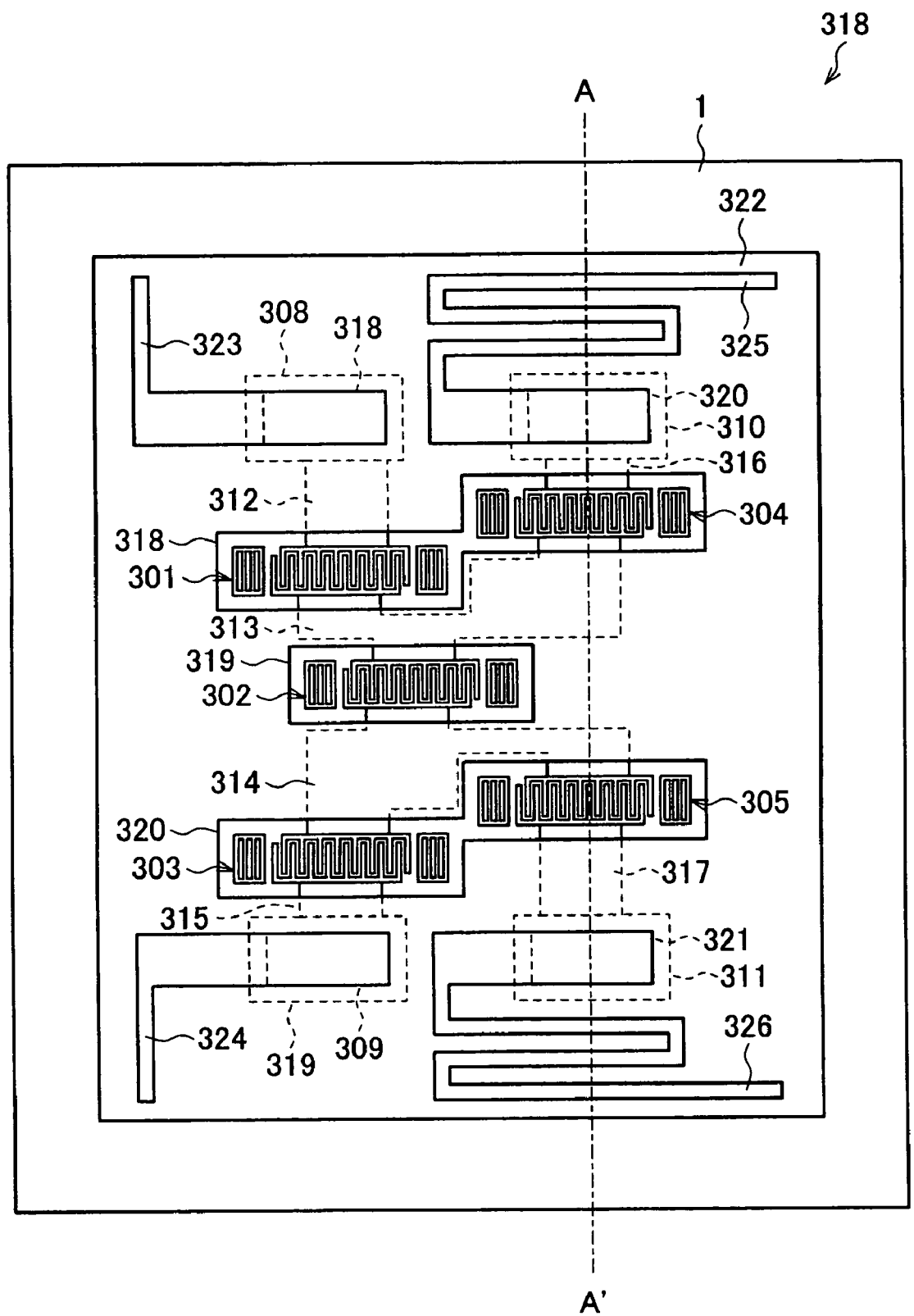
FIG. 16 is a plan view showing a state where wirings are formed on the insulating layer shown in FIG. 15.

Then, as shown in FIG. 16, wirings (first wirings) 323 to 326 connected to the conductive pads 308 to 311 through the conductive openings 318 to 321 are formed on the insulating layer 322. In this configuration, each of the wirings 325 and 326 includes an inductor L. Alternatively, each wiring may include a capacitor C. The inductors L in the wirings 325 and 326 correspond to the inductors 306 and 307.

Figure 17:
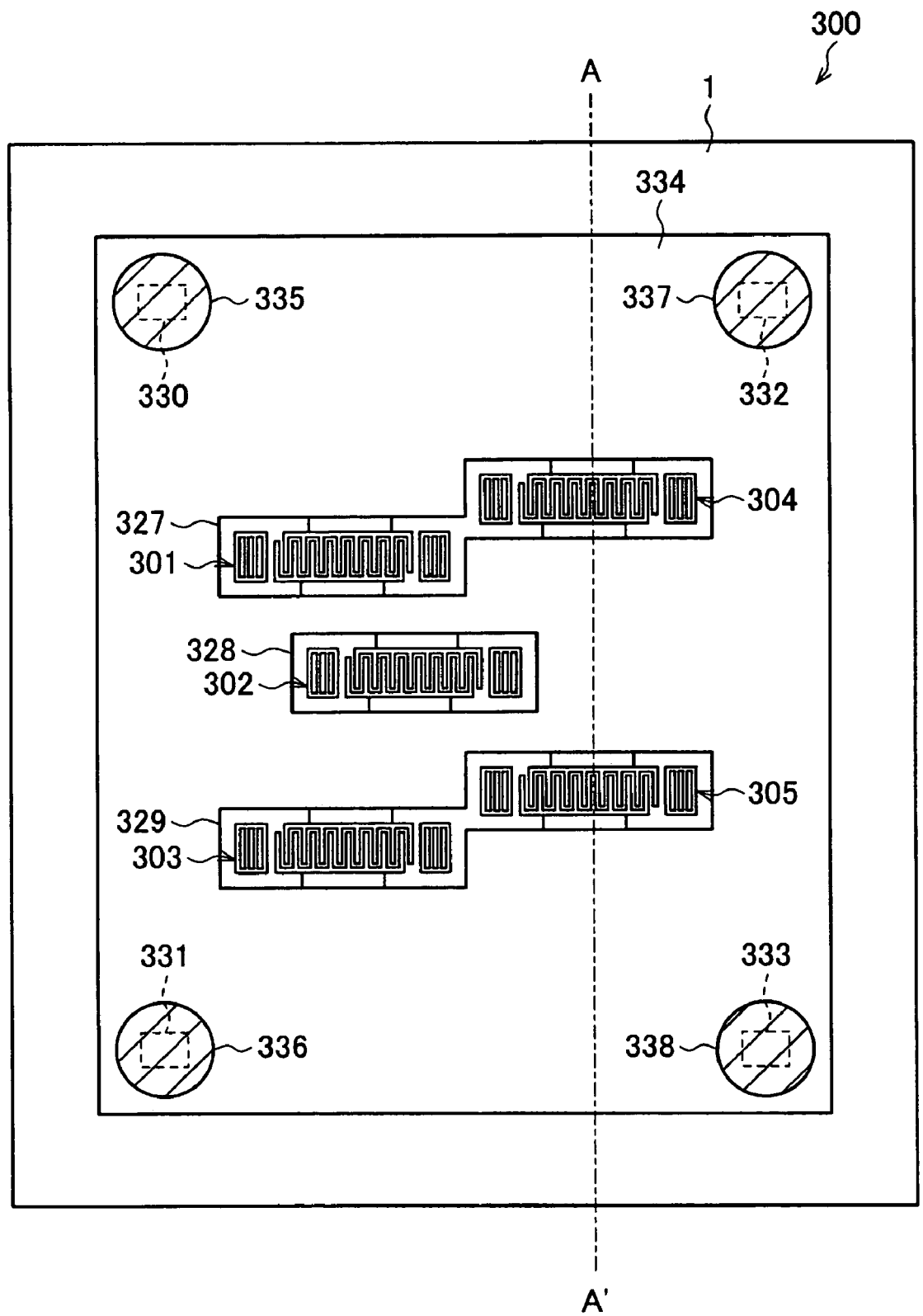
FIG. 17 is a plan view showing a state where a second insulating layer is formed on the insulating layer shown in FIG. 16 and external terminals are formed.

Further, as shown in FIG. 17, a second insulating layer 334 is formed on the insulating layer 322. The second insulating layer 334 includes second exciting portion protective openings 327 to 329 for exposing the SAW resonators 301 to 305 through the exciting portion protective openings 318 to 320 and second conductive openings 330 to 333 for exposing end portions of the wirings 323 to 326. Then, external terminals 335 to 338 connected to the wirings 323 to 326 through the second conductive openings 330 to 333 are formed on the second insulating layer 334, so that the SAW filter 300 is obtained. The portions of the external terminals 335 to 338 formed in the second conductive openings 330 to 333 define external terminal connecting members (second wirings). That is, each of the external terminals 335 to 338 includes an external terminal connecting member and an external terminal. The external terminal connecting member and the external terminal may be separate and each of them may be formed using a different method.

Figure 18:
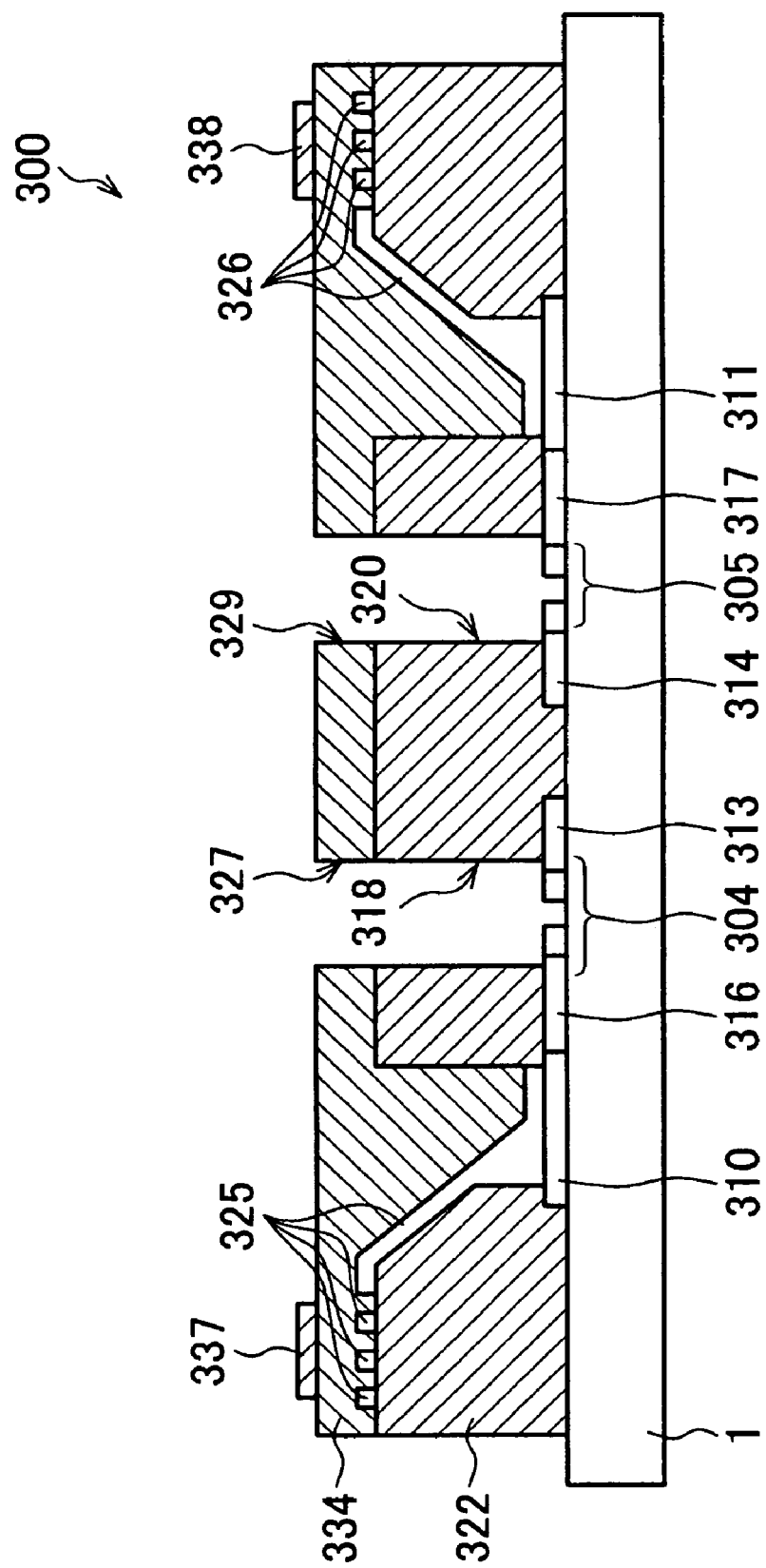
FIG. 18 is a cross-sectional view showing the SAW device according to the modification of the second preferred embodiment of the present invention.

FIG. 18 is a cross-sectional view of the produced SAW filter 300, taken along the line A–A' in FIGS. 15 to 17.

As shown in FIG. 18, in the SAW filter 300, vibrating space for the SAW resonators 304 and 305 is obtained by providing the exciting portion protective openings 318 and 320 and the second exciting portion protective openings 327 and 329.

Alternatively, a protective film may be formed on the IDT of each SAW resonator so as to protect the IDT. Further, the IDT can be protected by covering each second exciting portion protective opening by a lid.

Also, instead of forming the conductive pads 308 to 311, the wirings 312, 315, 316, and 317 may be connected to the wirings 323 to 326, respectively.

Hereinafter, a SAW filter according to another modification of this preferred embodiment will be described with reference to FIGS. 19 to 24.

Figure 19:
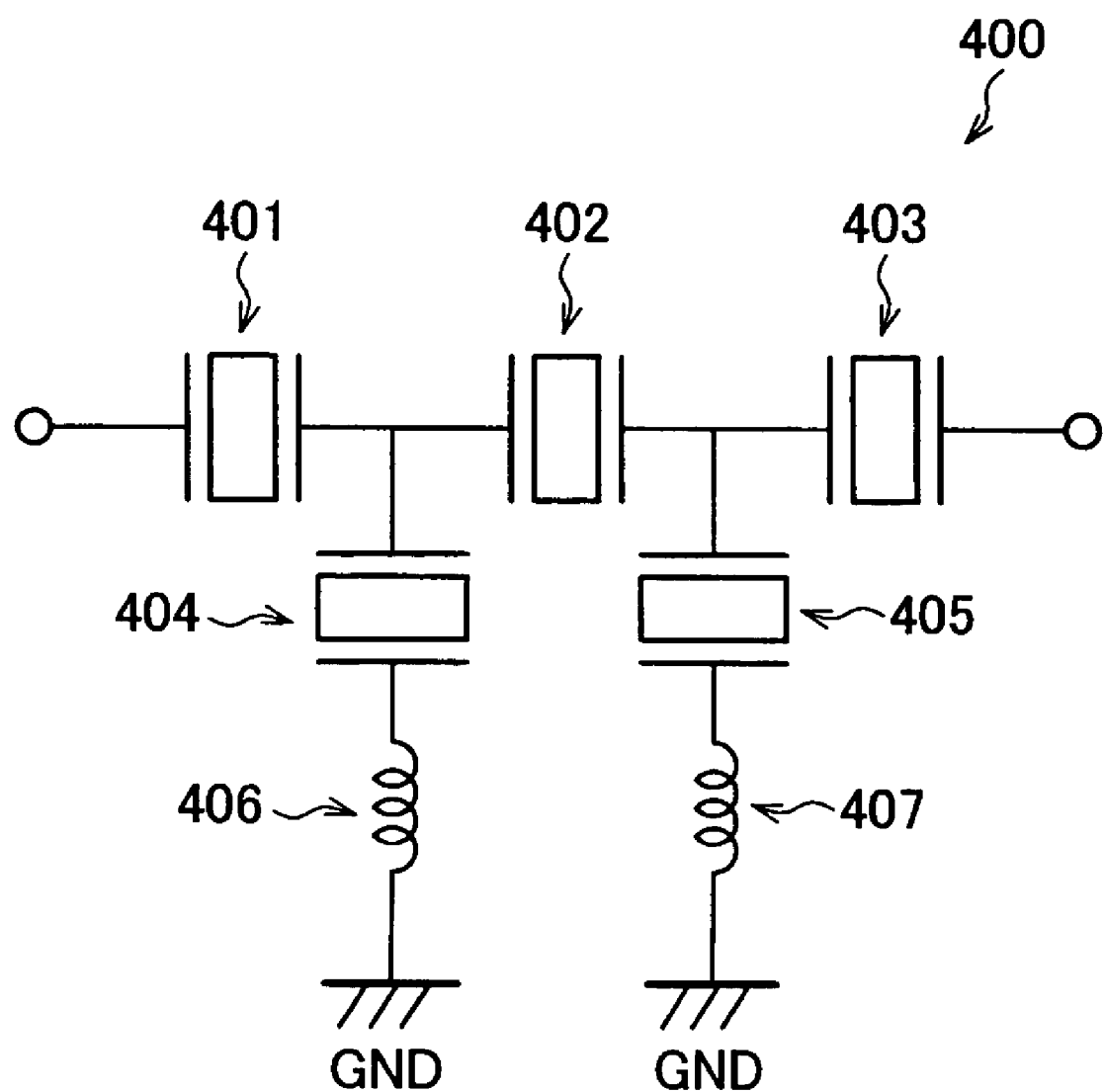
FIG. 19 is a circuit diagram showing a SAW device according to another modification of the second preferred embodiment of the present invention.

FIG. 19 is a circuit diagram showing a SAW filter 400 of this modification. The SAW filter 400 includes SAW resonators 401 to 405 arranged in a ladder configuration, each resonator including an IDT (vibrating portion). The SAW resonators 401 to 403 are series resonators and the SAW resonators 404 and 405 are parallel resonators. Inductors 406 and 407 are connected to the SAW resonators 404 and 405 in series, respectively.

Hereinafter, the SAW filter 400 will be described with reference to FIGS. 20 to 24.

Figure 20:
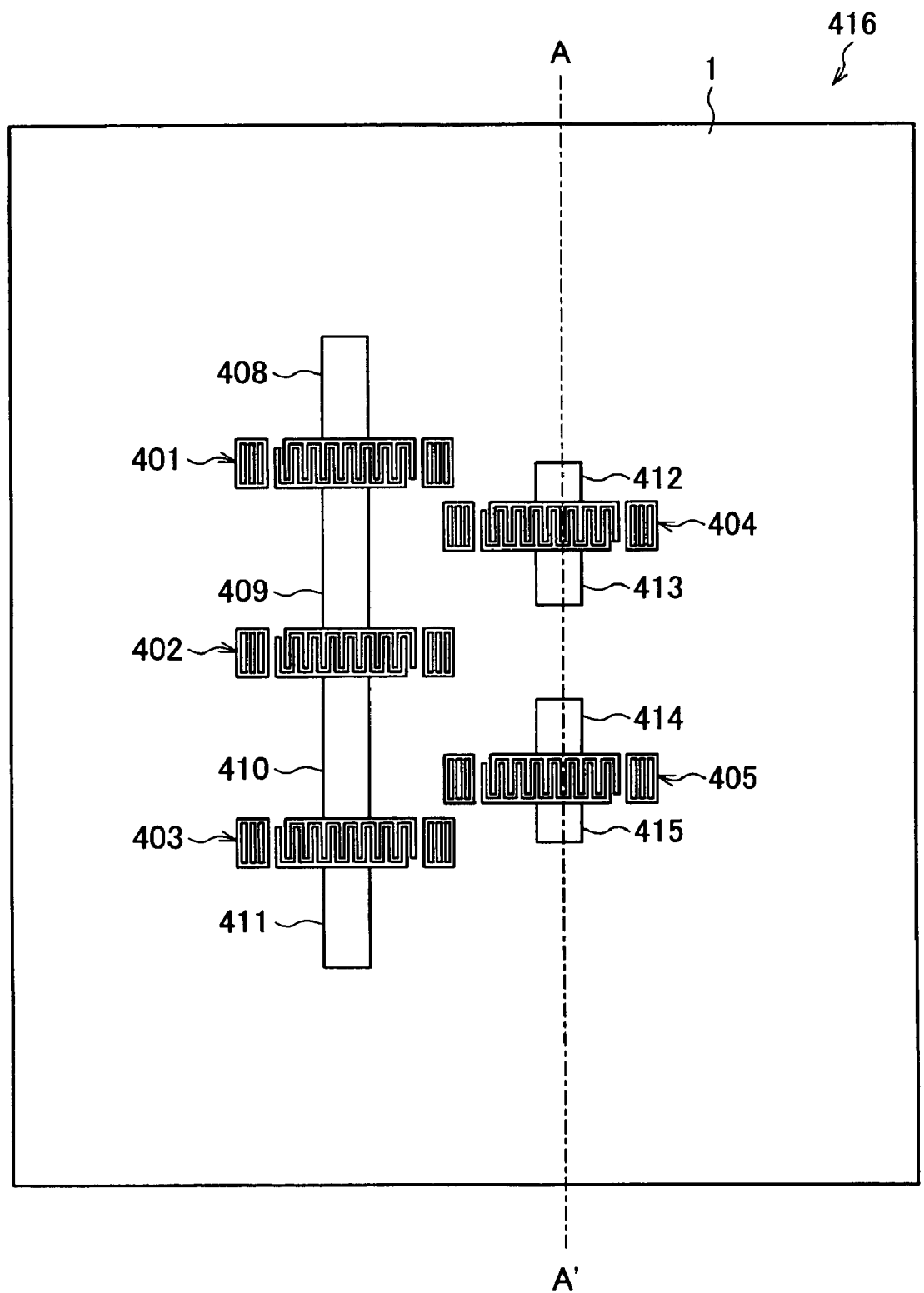
FIG. 20 is a plan view showing a SAW element of the SAW device according to the above-described another modification of the second preferred embodiment of the present invention.

First, as shown in FIG. 20, the SAW resonators 401 to 405 and wirings (element wirings) 408 to 415 are formed on the piezoelectric substrate 1 so as to define a SAW element 416.

Figure 21:
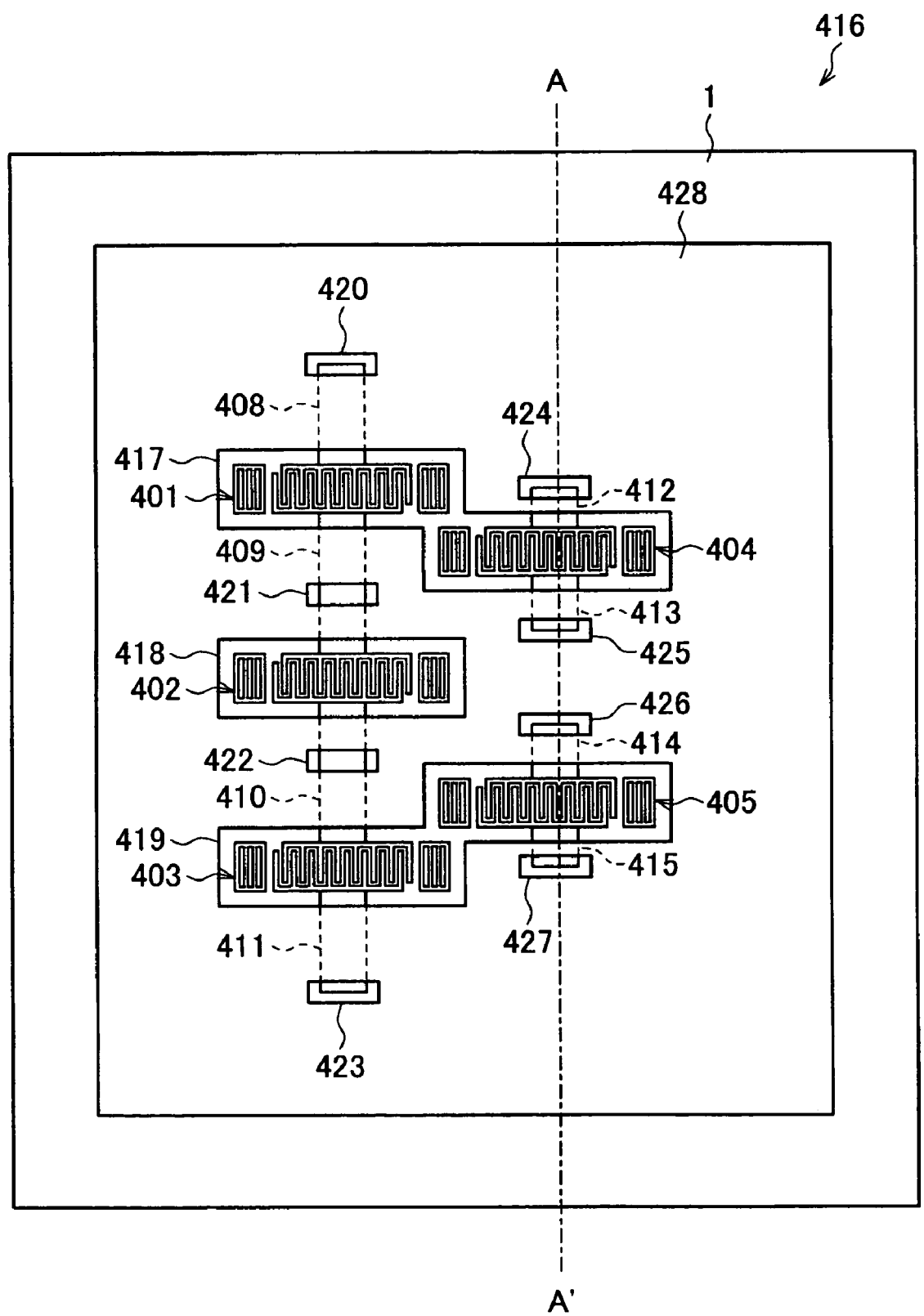
FIG. 21 is a plan view showing a state where an insulating layer is formed on the SAW element shown in FIG. 20.

Then, as shown in FIG. 21, an insulating layer 428 is formed on the SAW element 416. The insulating layer 428 includes exciting portion protective openings 417 to 419 for exposing the SAW resonators 401 to 405 and conductive openings 420 to 427 for exposing the wirings 408 to 415. The insulating layer 428 may cover substantially the entire surface of the piezoelectric substrate 1.

Figure 22:
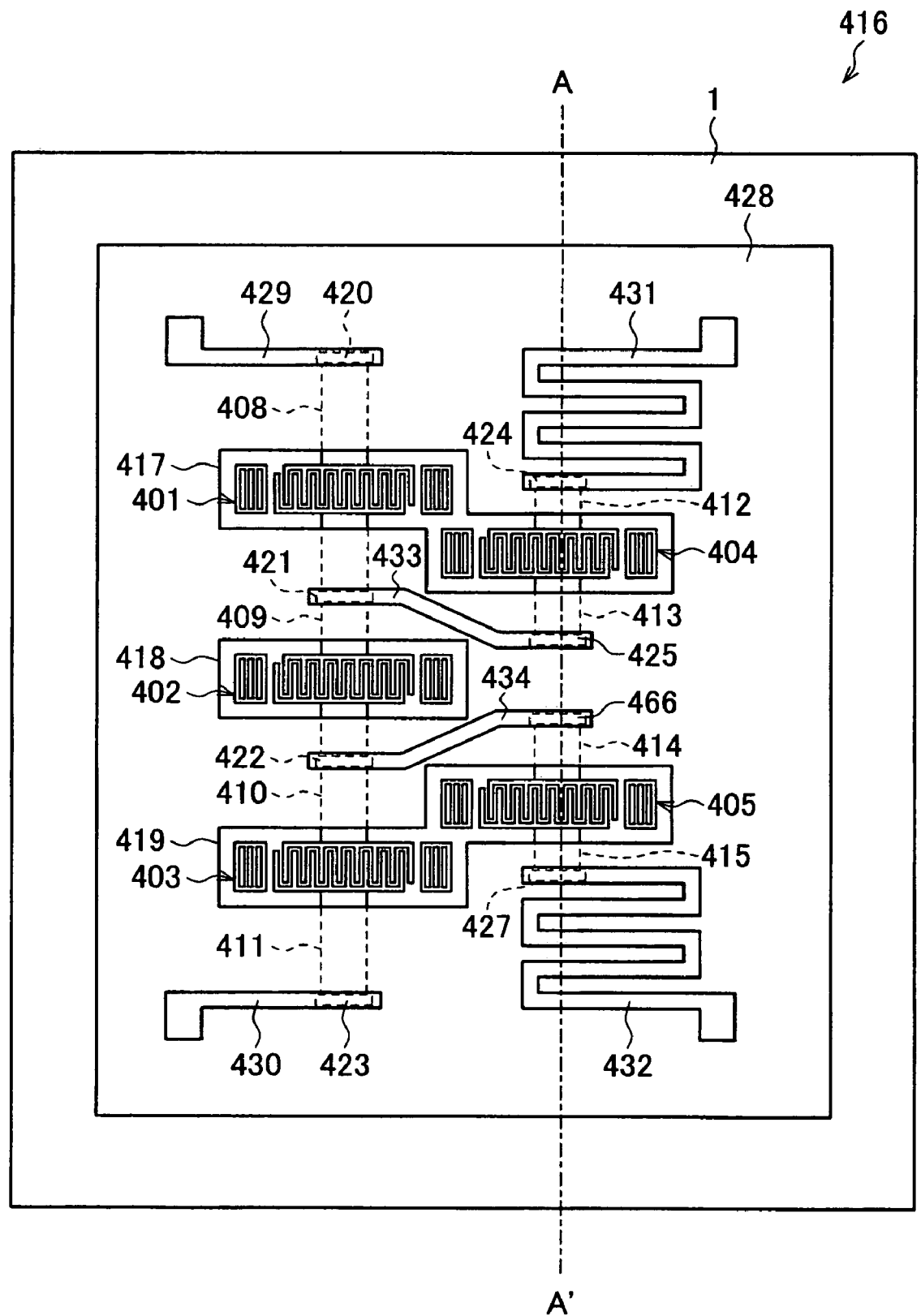
FIG. 22 is a plan view showing a state where wirings are formed on the insulating layer shown in FIG. 21.

Then, as shown in FIG. 22, wirings (first wirings) 429 to 432 connected to the wirings 408, 411, 412, and 415 through the conductive openings 420, 423, 424, and 427 are formed on the insulating layer 428. Also, a connecting wiring (first wiring) 433 for connecting the wirings 409 and 413 and a connecting wiring (first wiring) 434 for connecting the wirings 410 and 414 are formed. In this configuration, each of the wirings 431 and 432 includes an inductor L. Alternatively, each wiring may include a capacitor C. The inductors L in the wirings 431 and 432 correspond to the inductors 406 and 407.

Figure 23:
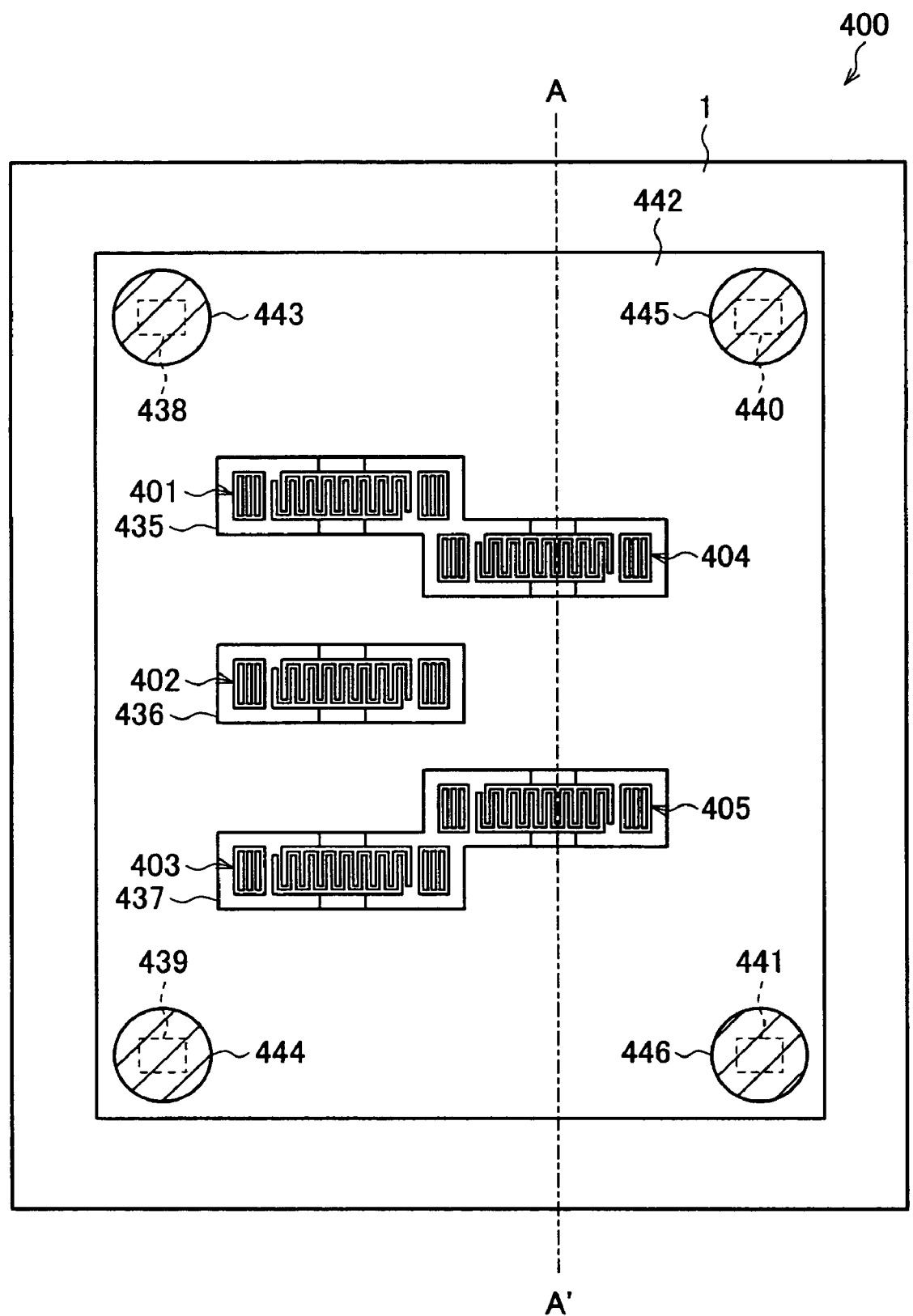
FIG. 23 is a plan view showing a state where a second insulating layer is formed on the insulating layer shown in FIG. 22 and external terminals are formed.

Further, as shown in FIG. 23, a second insulating layer 442 is formed on the insulating layer 428. The second insulating layer 442 includes second exciting portion protective openings 435 to 437 for exposing the SAW resonators 401 to 405 through the exciting portion protective openings 417 to 419 and second conductive openings 438 to 441 for exposing end portions of the wirings 429 to 432. Then, external terminals 443 to 446 connected to the wirings 429 to 432 through the second conductive openings 438 to 441 are formed on the second insulating layer 442. The portions of the external terminals 443 to 446 formed in the second conductive openings 438 to 441 define external terminal connecting members (second wirings). That is, each of the external terminals 443 to 446 includes an external terminal connecting member and an external terminal. The external terminal connecting member and the external terminal may be separate and each of them may be formed using a different way.

Then, a lid for covering the second exciting portion protective openings 435 to 437 is formed by thermo-compression bonding or other suitable method. Accordingly, the SAW filter 400 is obtained. Preferably, a plate lid including photosensitive polyimide, polyethylenenaphtalate, liquid crystal polymer, glass, silicon, or alumina is used. By using the lid, the IDTs of the SAW resonators are protected. Further, short circuiting caused by contact between conductive particles and the IDTs is prevented. That is, degradation in the characteristic of the SAW filter is prevented.

Figure 24:
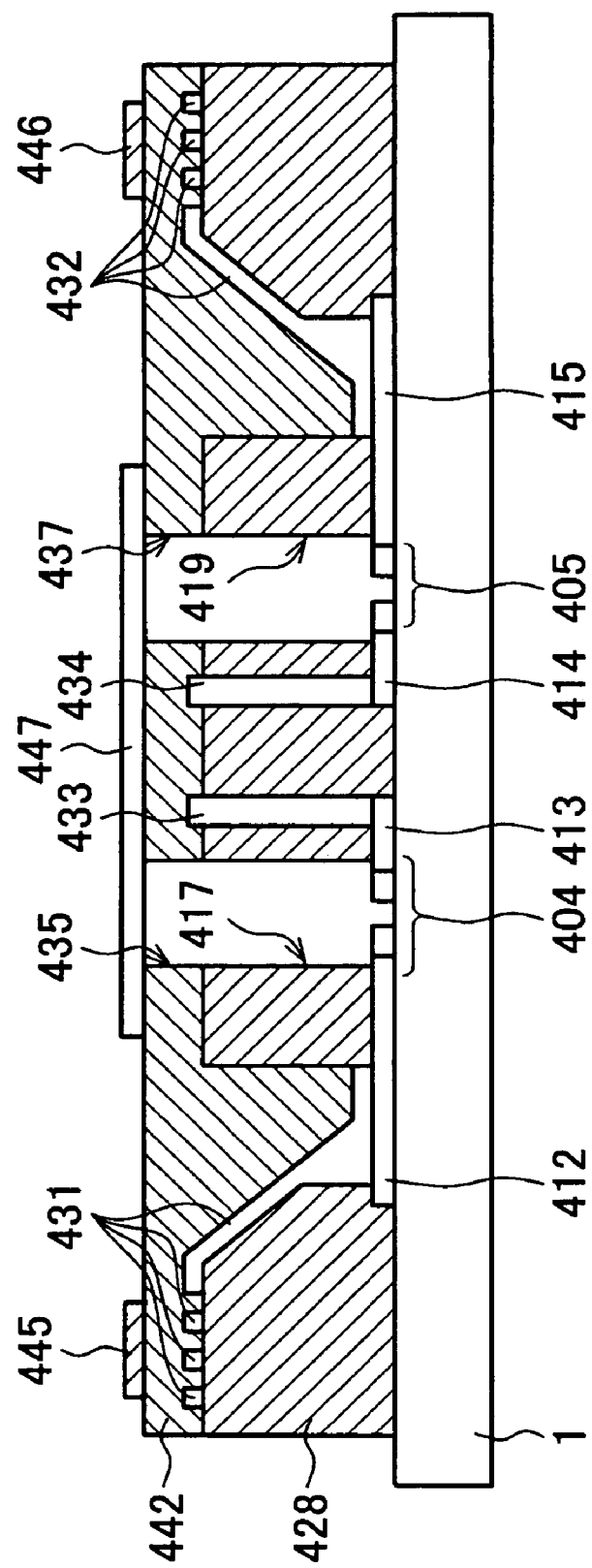
FIG. 24 is a circuit diagram showing the SAW device according to the above-described another modification of the second preferred embodiment of the present invention.

FIG. 24 is a cross-sectional view showing the produced SAW filter 400, taken along the line A–A' in FIGS. 20 to 23.

As shown in FIG. 24, in the SAW filter 400, an exciting space (vibrating space) for the IDTs is obtained by the lid 447, so that the IDTs are protected.

In the above-described SAW filters, an element wiring is connected to each IDT on the piezoelectric substrate 1, but the element wiring may be omitted. In that case, each conductive opening is formed in the insulating layer such that the bus bar of each IDT is exposed therefrom. Accordingly, space for forming wirings and conductive pads on the piezoelectric substrate is no longer needed, and thus the SAW filter is miniaturized.

In the second preferred embodiment, a SAW filter is preferably used as a piezoelectric filter. Alternatively, a piezoelectric thin-film filter may be used as a piezoelectric filter. In the piezoelectric thin-film filter, a piezoelectric thin-film element is provided as a piezoelectric element. The piezoelectric thin-film element includes an Si substrate having an opening or a recessed portion, and at least one piezoelectric thin-film resonator (vibrating portion) formed by sandwiching the upper and lower surfaces of a thin-film portion having at least one layer of piezoelectric thin-film (comprising ZnO or AlN) provided on the opening or the recessed portion by at least one pair of upper and lower electrodes facing each other. Alternatively, the Si substrate may not include an opening or recessed portion, and space may be provided between the lower electrode and the Si substrate. In this piezoelectric thin-film filter, vibrating space for the piezoelectric thin-film resonator is provided by an exciting portion protective opening. Also, by sealing the exciting portion protective opening with a lid, the piezoelectric thin-film resonator is protected. A protective film is not provided in the piezoelectric filter.

In the second preferred embodiment, the second conductive opening is displaced from the position of the conductive opening. However, the positions of the conductive opening and the second conductive opening may correspond to each other. With this arrangement, conductive pads and a portion of the wirings are unnecessary, and thus, the piezoelectric component is miniaturized. Further, by removing the conductive pads and a portion of the wirings, parasitic capacitance is reduced.

In the above-described preferred embodiments, a piezoelectric substrate is preferably used for a SAW element. When wirings are provided on the piezoelectric substrate, parasitic capacitance is generated at a portion where wirings having different potentials face each other in a plan view due to high permittivity of the piezoelectric substrate, and thus insertion loss occurs. However, in the SAW filter of preferred embodiments of the present invention, the number of wirings provided on the piezoelectric substrate is reduced, and necessary wirings is provided on a resin layer or bonded substrate including a material having lower permittivity than that of the piezoelectric substrate. Accordingly, generation of parasitic capacitance is suppressed at a portion where wirings having different potentials face each other in a plan view.

The present invention is not limited to the above-described preferred embodiments, and various modifications can be made within the scope of the attached claims. Also, technical methods disclosed in the preferred embodiments may be arbitrarily combined so as to obtain other embodiments, which are within the scope of the present invention.

According to the present invention, piezoelectric components, such as SAW devices and piezoelectric thin-film filters, used for delay lines and filters are miniaturized. Further, the piezoelectric components can be used for communication apparatuses such as portable phones, and the communication apparatuses are also miniaturized.

The invention claimed is:

1. A piezoelectric component comprising:
   a piezoelectric element including at least one vibrating portion and an element wiring connected to the vibrating portion, which are provided on a substrate;
   an external terminal;
   an insulating layer including an opening defining a space for protecting the vibrating portion and a conductive opening; wherein
   the external terminal is connected to the element wiring through an external terminal connecting member provided in the conductive opening; and
   a protective film is provided in the opening defining the space for protecting the vibrating portion.

2. A piezoelectric component according to claim 1, wherein the opening defining the space for protecting the vibrating portion is covered by a lid.

3. A piezoelectric component comprising:
   a piezoelectric element including at least one vibrating portion and an element wiring connected to the vibrating portion, which are provided on a substrate;
   an external terminal;
   an insulating layer which includes a first opening defining a space for protecting the vibrating portion and a conductive opening and which is provided with a wiring connected to the element wiring through the conductive opening; and
   a second insulating layer which protects the wiring connected to the element wiring and which includes a second opening arranged over the first opening and a second conductive opening, the second insulating layer being provided on the insulating layer; wherein
   the external terminal is connected to the wiring connected to the element wiring through an external terminal connecting member provided in the second conductive opening.

4. A piezoelectric component according to claim 3, wherein the wiring connected to the element wiring includes at least one of a capacitor and an inductor.

5. A piezoelectric component according to claim 3, wherein a protective film is provided in the second opening.

6. A piezoelectric component according to claim 3, wherein the second opening is covered by a lid.

7. A piezoelectric component according to claim 1, wherein the piezoelectric element is a SAW element including a vibrating portion including an IDT provided on a substrate.

8. A piezoelectric component according to claim 1, wherein the piezoelectric element is a piezoelectric thin-film element including a vibrating portion defined by sandwiching the upper and lower surfaces of a thin-film portion having at least a layer of piezoelectric thin-film provided on an opening or a recessed portion in a substrate by at least a pair of upper and lower electrodes facing each other.

9. A piezoelectric component according to claim 1, wherein the piezoelectric element is a piezoelectric thin-film element including a vibrating portion defined by sandwiching the upper and lower surfaces of a thin-film portion having at least a layer of piezoelectric thin-film provided on a substrate by at least a pair of upper and lower electrodes facing each other, wherein a space is provided between the substrate and the lower electrode in the vibrating portion.

* * * * *